United States Patent
Ito et al.

(10) Patent No.: US 7,011,874 B2
(45) Date of Patent: *Mar. 14, 2006

(54) CERAMIC SUBSTRATE FOR SEMICONDUCTOR PRODUCTION AND INSPECTION DEVICES

(75) Inventors: Yasutaka Ito, Gifu (JP); Yasuji Hiramatsu, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 7 days.

This patent is subject to a terminal disclaimer.

(21) Appl. No.: 09/926,296

(22) PCT Filed: Feb. 8, 2001

(86) PCT No.: PCT/JP01/00889

§ 371 (c)(1),
(2), (4) Date: Dec. 27, 2001

(87) PCT Pub. No.: WO01/59833

PCT Pub. Date: Aug. 16, 2001

(65) Prior Publication Data
US 2003/0039796 A1    Feb. 27, 2003

(30) Foreign Application Priority Data
Feb. 8, 2000  (JP) .............................. 2000-030896

(51) Int. Cl.
*B32B 1/00*    (2006.01)

(52) U.S. Cl. .................................... 428/64.1; 219/649
(58) Field of Classification Search ............ 428/64.1, 428/66.6; 118/500, 725, 730; 219/649, 219/444.1
See application file for complete search history.

(56) References Cited

U.S. PATENT DOCUMENTS

| | | | |
|---|---|---|---|
| 3,067,310 A | 12/1962 | Walz et al. |
| 4,034,207 A | 7/1977 | Tamada et al. |
| 4,443,691 A | 4/1984 | Sauer |
| 4,555,358 A | 11/1985 | Matsushita et al. |
| 5,001,087 A | 3/1991 | Kubota et al. |
| 5,068,517 A | 11/1991 | Tsuyuki et al. |
| 5,072,236 A | 12/1991 | Tatsumi et al. |
| 5,082,163 A | 1/1992 | Kanahara et al. |
| 5,310,453 A | 5/1994 | Fukasawa et al. |
| 5,408,574 A | 4/1995 | Deevi et al. |
| 5,456,757 A | 10/1995 | Aruga et al. |
| 5,473,137 A | 12/1995 | Queriaud et al. |

(Continued)

FOREIGN PATENT DOCUMENTS

EP    0 393 524    10/1990

(Continued)

OTHER PUBLICATIONS

U.S. Appl. No. 09/926,296, filed Dec. 27, 2001, Ito et al.

(Continued)

*Primary Examiner*—Alexander S. Thomas
(74) *Attorney, Agent, or Firm*—Oblon, Spivak, McClelland, Maier & Neustadt, P.C.

(57) ABSTRACT

The object of the present invention is to provide a ceramic substrate that can provide a substantially uniform temperature distribution to a surface of the ceramic substrate where a semiconductor wafer is treated. A ceramic substrate for a semiconductor-producing/examining device according to the present invention is a ceramic substrate having a conductor formed on a surface of the ceramic substrate or inside the ceramic substrate, wherein said substrate is containing oxygen and having a disc form, the diameter thereof exceeding 250 mm and a thickness thereof being 25 mm or less.

10 Claims, 7 Drawing Sheets

U.S. PATENT DOCUMENTS

| | | | |
|---|---|---|---|
| 5,492,730 A | 2/1996 | Balaba et al. | |
| 5,563,764 A | 10/1996 | Arakawa et al. | |
| 5,582,215 A | 12/1996 | Yamamoto et al. | |
| 5,656,093 A * | 8/1997 | Burkhart et al. | 118/500 |
| 5,756,215 A | 5/1998 | Sawamura et al. | |
| 5,843,589 A | 12/1998 | Hoshiya et al. | |
| 5,880,439 A | 3/1999 | Deevi et al. | |
| 5,908,799 A | 6/1999 | Kobayashi et al. | |
| 5,965,193 A | 10/1999 | Ning et al. | |
| 5,998,321 A | 12/1999 | Katsuda et al. | |
| 6,025,579 A | 2/2000 | Tanaka et al. | |
| 6,080,970 A | 6/2000 | Yoshida et al. | |
| 6,086,990 A | 7/2000 | Sumino et al. | |
| 6,107,638 A | 8/2000 | Sumino et al. | |
| 6,133,557 A | 10/2000 | Kawanabe et al. | |
| 6,176,140 B1 | 1/2001 | Autenrieth et al. | |
| 6,182,340 B1 | 2/2001 | Bishop | |
| 6,183,875 B1 | 2/2001 | Ning et al. | |
| 6,272,002 B1 | 8/2001 | Mogi et al. | |
| 6,448,538 B1 | 9/2002 | Miyata | |
| 6,465,763 B1 | 10/2002 | Ito et al. | |
| 6,475,606 B1 | 11/2002 | Niwa | |
| 6,507,006 B1 | 1/2003 | Hiramatsu et al. | |
| 2002/0010073 A1 | 1/2002 | Beall et al. | |
| 2003/0015521 A1 | 1/2003 | Ito | |

FOREIGN PATENT DOCUMENTS

| | | |
|---|---|---|
| EP | 1 109 423 A1 | 6/2001 |
| JP | 62-167396 | 10/1987 |
| JP | 2-275770 | 11/1990 |
| JP | 2-292058 | 12/1990 |
| JP | 3-222761 | 10/1991 |
| JP | 3-255625 | 11/1991 |
| JP | 5-8140 | 1/1993 |
| JP | 6-48837 | 2/1994 |
| JP | 6-52974 | 2/1994 |
| JP | 7-11446 | 1/1995 |
| JP | 7-94576 | 4/1995 |
| JP | 7-326655 | 12/1995 |
| JP | 8-19982 | 1/1996 |
| JP | 8-133840 | 5/1996 |
| JP | 2513995 | 7/1996 |
| JP | 8-273814 | 10/1996 |
| JP | 9-165264 | 6/1997 |
| JP | 9-180867 | 7/1997 |
| JP | 9-283607 | 10/1997 |
| JP | 9-283608 | 10/1997 |
| JP | 2798570 | 9/1998 |
| JP | 10-270540 | 10/1998 |
| JP | 10-275524 | 10/1998 |
| JP | 10-279359 | 10/1998 |
| JP | 10-308348 | 11/1998 |
| JP | 11-40330 | 2/1999 |
| JP | 11-67886 | 3/1999 |
| JP | 11-74064 | 3/1999 |
| JP | 11-100270 | 4/1999 |
| JP | 11-168134 | 6/1999 |
| JP | 11-312570 | 11/1999 |
| JP | 11-339939 | 12/1999 |
| JP | 2000-12194 | 1/2000 |
| JP | 2000-143349 | 5/2000 |

OTHER PUBLICATIONS

U.S. Appl. No. 10/732,296, filed Dec. 11, 2003, Ito et al.
U.S. Appl. No. 10/746,081, filed Dec. 29, 2003, Hiramatsu et al.
U.S. Appl. No. 10/755,308, filed Jan. 13. 2004, Hiramatsu et al.
U.S. Appl. No. 10/766,027, filed Jan. 29, 2004, Ito et al.
U.S. Appl. No. 09/926,296, filed Dec. 27, 2001, Ito et al.
U.S. Appl. No. 10/876,665, filed Jun. 28, 2004, Ito et al.
U.S. Appl. No. 10/901,109, filed Jul. 29, 2004, Hiramatsu et al.
U.S. Appl. No. 10/900,113, filed on Jul. 28, 2004, Hiramatsu et al.
U.S. Appl. No. 09/926,296, filed Dec. 27, 2001, Ito et al.
U.S. Appl. No. 10/855,324, filed May 28, 2004, Ito et al.
U.S. Appl. No. 10/928,146, filed Aug. 30, 2004, Hiramatsu et al.
U.S. Appl. No. 09/926,296, filed Dec. 27, 2001, Ito et al.

* cited by examiner

CERAMIC SUBSTRATE FOR SEMICONDUCTOR PRODUCTION AND INSPECTION DEVICES

TECHNICAL FIELD

The present invention relates mainly to ceramic substrates used as a device for producing or examining semiconductors, such as ceramic substrates for hot plates (ceramic heaters), electrostatic chucks and wafer probers.

BACKGROUND ART

As the device for producing or examining semiconductors including an etching device, a chemical vapor deposition device and the like, heaters or wafer probers and the like using substrates made of metal such as stainless steel or aluminum alloy, have been conventionally used.

However, heaters made of metal have problems that they have poor temperature control characteristics and they are heavy and bulky since they are thick; and also have another problem that they have poor corrosion resistance to corrosive gases.

In order to solve such problems, heaters which use ceramic such as aluminum nitride have been developed in place of heaters made of metal.

Since such ceramic heaters have the advantage that a warp and the like of ceramic substrates can be prevented even if they are not made so thick due to high rigidity thereof, they are especially suitable for wafer probers or electrostatic chucks.

In recent years, as the semiconductor wafer becomes larger and the diameter thereof becomes larger, the diameter of ceramic substrates used in electrostatic chucks and the like used for producing or examining of semiconductor wafers are required to be bigger so as to put the enlarged semiconductor wafers thereon. Thus, for example, a hot plate having a diameter of 300 mm and a thickness of 17 mm composed of aluminum nitride ceramic is disclosed in JP Kokai Hei 11-74064 and so on.

SUMMARY OF THE INVENTION

There existed a problem that such enlargement of an electrostatic chuck and the like results in the deterioration of a temperature-rising property or a heat uniformity of a ceramic substrate, those are the properties being demanded at the production of semiconductor devices and the like.

The inventors of the present invention studied earnestly to solve the above problems. Consequently, they have found that the reason why the temperature-rising property or the heat uniformity of such a large ceramic substrate having a diameter exceeding 250 mm is deteriorated is the increase of a heat capacity of a ceramic substrate. Simultaneously, they have found that the temperature-rising property and the heat uniformity can be improved: by lowering a barrier of heat conduction between ceramic particles through the improvement of sinterability by incorporating oxygen in a ceramic substrate; and by the reduction of the heat capacity itself through the adjustment of the thickness of the ceramic substrate to 25 mm or less.

Moreover, in the case of a large ceramic substrate which has a diameter exceeding 250 mm, if the thickness thereof is adjusted to 25 mm or less, a warp tends to be generated at a high temperature. They have found that the warp can be prevented almost completely by: forming a conductor at the position of 60% in a thickness-direction from the bottom face opposite to a wafer treating face of the ceramic substrate; and using a nitride ceramic containing oxygen or an oxide ceramic as the ceramic. Thus, they have accomplished the present invention.

In case a disk-shaped ceramic substrate has a diameter of 250 mm or more, the ceramic substrate is adjusted to have a thickness of 25 mm or less in order to reduce the heat capacity of the ceramic substrate. In such a case, if a resistance heating element is disposed inside the ceramic substrate, the distance between the resistance heating element and the heating face becomes shorter correspondingly, resulting in an occurrence of a temperature distribution similar to the pattern of the resistance heating element. The present invention has been accomplished through the finding that disposing of a conductor, such as a resistance heating element, on the back side of a ceramic substrate makes it possible to keep the substantial distance between the heating face and the resistance heating element, and can improve the temperature-rising property and the heat uniformity.

Besides, although the adjustment of the thickness of a ceramic substrate to 25 mm or less makes the ceramic substrate apt to warp at a high temperature, the present invention can also prevent such a warp.

In JP Kokai Hei 11-74064, a hot plate composed of aluminum nitride ceramic having a diameter of 300 mm and a thickness of 17 mm is disclosed, but there is no description or suggestion on the problem on the warp at a high temperature. The publication, therefore, never affect the novelty or inventive step of the present invention.

A first aspect of the present invention is a ceramic substrate for a semiconductor-producing/examining device having a conductor formed on a surface of the ceramic substrate or inside the ceramic substrate, wherein said substrate is containing oxygen and has a disc form, the diameter thereof exceeding 250 mm and a thickness thereof being 25 mm or less.

A second aspect of the present invention is a ceramic substrate for a semiconductor-producing/examining device having a conductor formed on a surface of the ceramic substrate, wherein said substrate has a disc form, the diameter thereof exceeding 250 mm and a thickness thereof being 25 mm or less.

The above-mentioned first and second aspects of inventions are different in the position where a conductor is formed and in the respect whether oxygen is contained or not, but they are the same with respect to the other constituent features. The contents of the two inventions, therefore, will be described together below.

Figure 1:
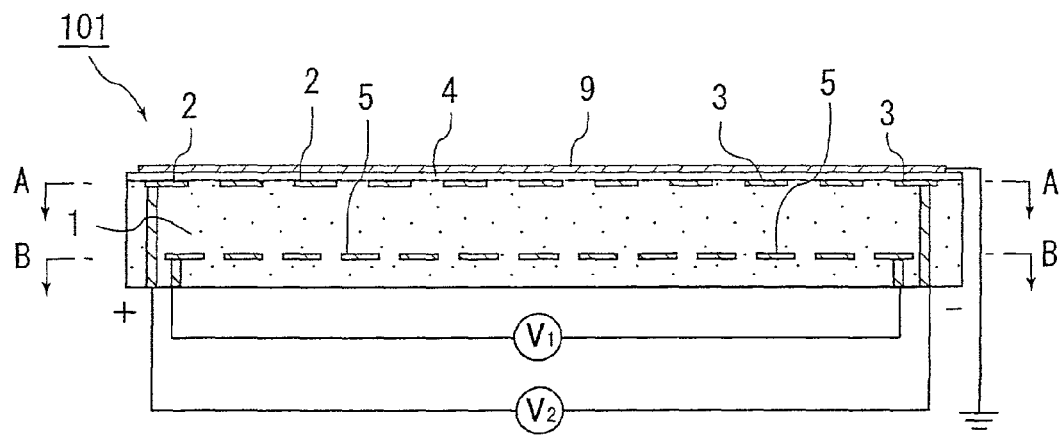
FIG. 1 is a longitudinal sectional view schematically showing an electrostatic chuck that is an embodiment of a ceramic substrate for use in a device for producing or examining a semiconductor according to the present invention.

| Explanation of symbols | |
|---|---|
| 101 | Electrostatic chuck |
| 1, 43 | Ceramic substrate |
| 2, 22, 32a, 32b | Chuck positive electrostatic layer |
| 3, 23, 33a, 33b | Chuck negative electrostatic layer |
| 2a, 3a | Semicircle arc part |
| 2b, 3b | Comb teeth-shaped part |
| 4 | Ceramic dielectric film |
| 5, 49 | Resistance heating element |
| 6, 18 | External terminal pin |
| 9 | Silicon wafer |
| 11 | Bottomed hole |
| 12 | Through hole |
| 16 | Conductor-filled through hole |
| 42 | Chuck top conductor layer |
| 45 | Guard electrode |
| 46 | Ground electrode |
| 47 | Groove |
| 48 | Suction hole |

DETAILED DESCRIPTION OF THE INVENTION

The ceramic substrate for a semiconductor producing/examining device according to the present invention is a ceramic substrate having a conductor formed on a surface of the ceramic substrate or inside the ceramic substrate, wherein said substrate is containing oxygen and has a disc form, the diameter thereof exceeding 250 mm and a thickness thereof being 25 mm or less. It is desirable that the above-mentioned ceramic substrate contains oxygen or is an oxide ceramic.

In the ceramic substrate of the present invention, the above-mentioned ceramic substrate is made large to have a diameter thereof exceeding 250 mm, and at the same time, the thickness thereof being 25 mm or less, so that the increase in the weight of the whole ceramic substrate is suppressed. Thus, the heat capacity of the ceramic substrate can be prevented from becoming too large, resulting in a ceramic substrate having uniform enough temperature distribution that raises no problems in the processing of semiconductor wafers and the like.

If the thickness of a ceramic substrate exceeds 25 mm, the heat capacity of the ceramic substrate becomes large. Particularly, if the ceramic substrate is heated and cooled by using temperature control means, the large heat capacity causes the deterioration in temperature-following property.

The thickness of the ceramic substrate is desirably 10 mm or less, and more desirably 5 mm or less. If it exceeds 10 mm, the heat capacity of the ceramic substrate at a temperature of 200° C. or more will become large, and the temperature controllability thereof, and the temperature uniformity of the face on which a semiconductor wafer will be placed, tend to become poor.

The above-mentioned ceramic substrate is used in a temperature range of 100 to 700° C. This is because in a temperature range of 100° C. or more, the Young's modulus of the ceramic is lowered and the ceramic tends to warp, so the advantageous effect of the present invention is beneficial.

The above-mentioned ceramic substrate desirably has a plurality of through holes in which lifter pins for a semiconductor wafer will be inserted. The reason is that when a ceramic substrate has through holes, the Young's modulus is lowered at a temperature of 100° C. or more, resulting in the release of the stress generated during processing, thus the substrate tends to warp. The advantageous effect of the present invention, therefore, becomes significant. The diameter of the through holes is desirably 0.5 mm to 30 mm.

In the ceramic substrate of the present invention, a silicon wafer is put on a surface of the ceramic substrate in the state that they contact each other. Besides, the silicon wafer may be supported by lifter pins and the like and held in the state that a given interval is kept between the silicon wafer and the ceramic substrate (reference to FIG. 9). Such a face on which a semiconductor wafer is placed or held will, in the following description, be expressed as a wafer treating face. When a semiconductor wafer is supported with a supporting pin, for example, a concave portion is formed in a ceramic substrate and a supporting pin is fitted in a concave portion so that its tip slightly projects from the wafer treating face and a semiconductor wafer is supported by the supporting pin.

When heating is conducted while a distance between a ceramic substrate and a semiconductor wafer is kept constant, the distance is desirably 50 to 5000 $\mu$m.

In the case that heating is conducted while a distance between a ceramic substrate and a semiconductor wafer is kept constant, unless the distance between the semiconductor wafer and the holding face of the ceramic substrate is made to be constant, the semiconductor wafer can not be heated uniformly. For this reason, there is a necessity of minimizing the warp amount of a ceramic substrate thus, the present invention can act particularly advantageously.

In the present invention, the warp amount is desirably less than 70 $\mu$m in a temperature range of 100 to 700° C. This is because if it exceeds 70 $\mu$m, a distance between a treating face (the heating face) of a ceramic substrate and a semiconductor wafer becomes uneven and the semiconductor wafer can not be heated uniformly.

The reason why the diameter of the ceramic substrate is set to be larger than 250 mm is that a diameter of a semiconductor wafer is becoming mainly 10 inches or more, and there is also a need for the ceramic substrates to become larger. Thus, the above-mentioned ceramic substrate is preferably 12 inches (300 mm) or more. This is because such a ceramic substrate will become the main stream of semiconductor wafers of the next generation. In addition, ceramic substrates having a diameter larger than 250 mm tend to warp due to their own weight and the like at a high temperature. Such a warp remarkably occurs in a ceramic with a thickness of 25 mm or less. In the present invention, by providing a conductor in a specific region of a ceramic wherein the warp easily occurs at such a high temperature, such a warp can be prevented.

The above-mentioned conductor is desirably disposed: in a region up to the position of 60% in the thickness-direction from the face opposite to the wafer treating face of the ceramic substrate; or on the above-mentioned face opposite to the wafer treating face. The warp is caused by the own weight or, in the case of ceramic substrates for wafer probers (hereinafter, mentioned as wafer probers), is caused by the pressure of probing. Therefore, when a ceramic substrate warps, a pulling force is applied on the face opposite to the wafer treating face. In the present invention, a ceramic substrate becomes able to resist to such a pulling force by providing it with a conductor and, thus the warp can be prevented.

Examples of the above-mentioned conductor include a conductive ceramic, a metal foil, a metal sintered body, a metal wire and the like. Generally, even at a high temperature, a Young's modulus of a metal does not drop easily. Hence, even if the Young's modulus of a ceramic drops at a high temperature, the presence of a metal foil, metal sintered body, metal wire and the like can prevent the drop in a Young's modulus of the whole. Moreover, since the above-mentioned conductive ceramic also has a bonding structure or a crystal structure similar to those of metal due to the fact that the conductive ceramic is conductive, its Young's modulus is not easily lowered at a high temperature and a ceramic substrate, therefore, can be prevented from warping at a high temperature.

Also, in the case which the above-mentioned conductor serves as a resistance heating element, it is desirably disposed: in a region up to the position of 50% in the thickness-direction from the face opposite to the wafer treating face of the ceramic substrate; or on the above-mentioned face opposite to the wafer treating face of the ceramic substrate. This is because: when heat is transmitted from a heating element to a wafer treating face through the inside of a ceramic substrate, the heat diffuses in the ceramic substrate to produce uniform heat, thus as a distance between the wafer treating face and the heating element becomes larger, the surface temperature of the wafer treating face tends to be uniform.

In the ceramic substrate for use in a semiconductor device according to the present invention, a ceramic substrate having a Young's modulus of 280 GPa or more in a temperature range of 25 to 800° C. is desirably employed.

This is because if a Young's modulus is less than 280 GPa, the rigidity is too low and, therefore, it is difficult to reduce the warp amount during the heating and then, the warp may cause the damage of a semiconductor wafer.

In the present invention, it is desirable that there are no pores, or even if there are pores, the pore diameter of the largest pore is 50 $\mu$m or less.

When there are no pores, a breakdown voltage at a high temperature becomes particularly high. On the other hand, when there are pores, a fracture toughness value becomes high. Accordingly, which design to take depends upon the required characteristics.

The reason why a high fracture toughness value is caused by the presence of pores is not clear, but it is presumed that the development of cracks is stopped by the pores.

In the present invention, the largest pore desirably has a pore diameter of 50 $\mu$m or less because if it exceeds 50 $\mu$m, a high breakdown voltage characteristic can not be kept particularly at a temperature of 200° C. or more.

The pore diameter of the largest pore is more desirably 10 $\mu$m or less because a warp amount decreases at a temperature of 200° C. or more.

The porosity and the pore diameter of the largest pore are adjusted: by a length of pressing time, pressure and temperature during sintering; and by an additive such as SiC or BN. SiC or BN can introduce pores since they inhibit sintering.

At the measurement of the pore diameter of the largest pore, 5 samples are prepared. Then, after polishing their surfaces and photographing the surfaces of the samples at 10 points for every samples with an electron microscope at a magnification of 2000 to 5000 times, the largest pore diameter is chosen in every photographs taken and the average of the 50 shots is defined as the largest pore diameter.

The above-mentioned nitride ceramic substrate desirably contains 0.05 to 10% by weight of oxygen. This is because, when the oxygen content is less than 0.05% by weight, a high breakdown voltage can not be kept and a warp at a high temperature can not be prevented, and, on the other hand, when the content exceeds 10% by weight, a breakdown voltage drops due to the drop of the high breakdown voltage characteristic of the oxide at a high temperature. This is also because, when the oxygen amount thereof exceeds 10% by weight, temperature rising/falling property becomes poor due to the drop in heat conductivity. Particularly, a content of 0.1 to 5% by weight is optimum.

Oxygen can be introduced: by heating raw material in the air or in oxygen; or by adding a sintering aid.

A ceramic containing oxygen (a nitride ceramic containing oxygen, a carbide ceramic containing oxygen and an oxide ceramic) do not easily warp at a high temperature because their Young's modulus do not easily drop at a high temperature.

The porosity is measured by an Archimedes' method. A sintered body is pulverized, and then the pulverized pieces are put in an organic solvent or mercury to determine its volume.

Then the true specific gravity of the pieces is obtained from the weight and the measured volume thereof, and the porosity is calculated from the true specific gravity and apparent specific gravity.

The ceramic material constituting the ceramic substrate of the present invention is not particularly limited and is exemplified by a nitride ceramic, a carbide ceramic and an oxide ceramic and the like.

Examples of the above-mentioned nitride ceramic include a metal nitride ceramic such as aluminum nitride, silicon nitride, boron nitride and titanium nitride and the like.

Examples of the above-mentioned carbide ceramic include a metal carbide ceramic such as silicon carbide, zirconium carbide, titanium carbide, tantalum carbide and tungsten carbide and the like.

Examples of the above-mentioned oxide ceramic include a metal oxide ceramic such as alumina, zirconia, cordierite and mullite and the like.

These ceramics may be used either alone or in combination of two or more kinds of them.

Among these ceramics, a nitride ceramic and an oxide ceramic are preferable because they do not easily cause a warp at a high temperature.

Among a nitride ceramic, aluminum nitride is most desirable because it has the highest heat conductivity as high as 180 W/m·K.

In the present invention, the ceramic substrate desirably contains a sintering aid.

As the sintering aid, an alkali metal oxide, an alkaline earth metal oxide and a rare-earth oxide can be used. Among these sintering aids, CaO, $Y_2O_3$, $Na_2O$, $Li_2O$ and $Rb_2O_3$ are desirable particularly. Alumina may also be used. The content thereof is desirably 0.1 to 20% by weight.

In the present invention, the ceramic substrate desirably contains 50 to 5000 ppm of carbon.

This is because, by incorporating carbon into the substrate, the ceramic substrate is made to be black, thus sufficient use of radiation heat is possible in the case of using the ceramic substrate as a heater.

The carbon may be either amorphous one or crystalline one. This is because the use of amorphous carbon can prevent a drop
in a volume resistivity at a high temperature and the use of crystalline carbon can prevent a drop in a heat conductivity at a high temperature. Accordingly, depending on the purpose, both crystalline carbon and amorphous carbon may be used together. The content of carbon is desirably 200 to 2000 ppm.

When the ceramic substrate contains carbon, the ceramic substrate desirably contains carbon so as to have a brightness of N6 or less based on the provision given in JIS Z 8721. This is because a ceramic substrate having such a brightness is superior in radiant heat capacity and covering-up property.

Herein, the brightness N is defined as follows: the brightness of ideal black is made to 0; that of ideal white is made to 10; respective colors are divided into 10 parts in the manner that the brightness of the respective colors is recognized stepwise between the brightness of black and that of white at equal intensity intervals; and the resultant parts are indicated by symbols N0 to N10, respectively.

Actual brightness is measured by comparison with color chips corresponding to N0 to N10. One place of decimals in this case-is made to 0 or 5.

The ceramic substrate of the present invention is a ceramic substrate used for a device for producing semiconductors or examining semiconductors. Examples of the concrete device include an electrostatic chuck, a wafer prober, a hot plate and a susceptor and the like.

Figure 2:
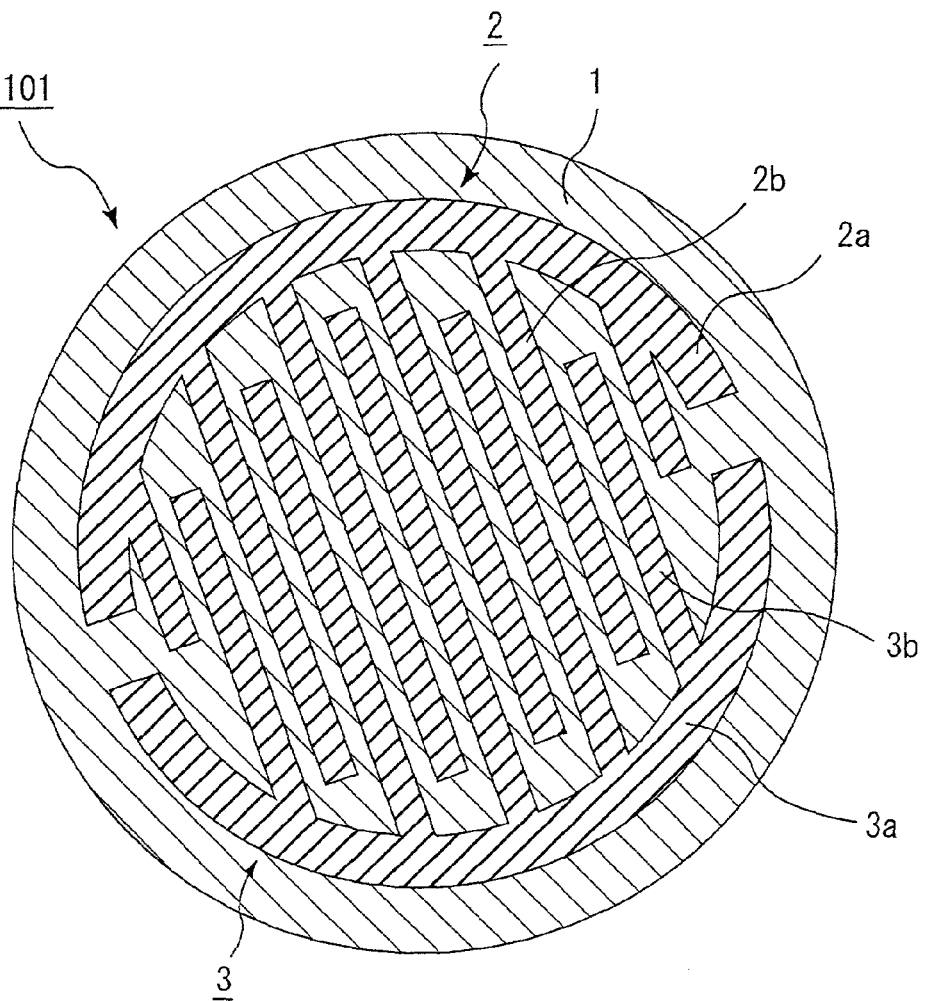
FIG. 2 is an A—A line sectional view of the electrostatic chuck shown in FIG. 1.
Figure 3:
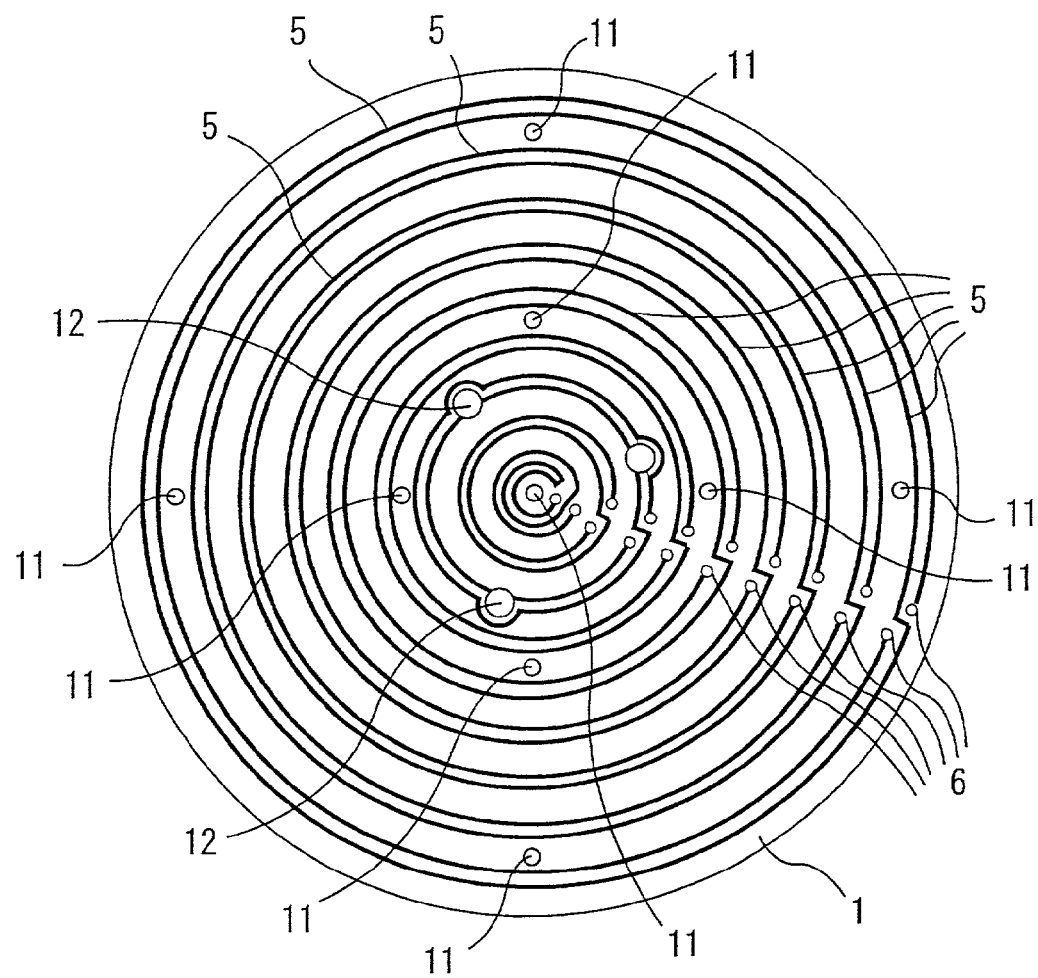
FIG. 3 is a B—B line sectional view of the electrostatic chuck shown in FIG. 1.

FIG. 1 is a longitudinal sectional view schematically showing an example of an electrostatic chuck, which is an embodiment of a ceramic substrate of the present invention. FIG. 2 is a sectional view taken along the A—A line in the electrostatic chuck illustrated in FIG. 1. FIG. 3 is a sectional view taken along the B—B line in the electrostatic chuck illustrated in FIG. 1.

In this electrostatic chuck 101, an electrostatic electrode layer comprising a chuck positive electrostatic layer 2 and a chuck negative electrostatic layer 3 is embedded in a ceramic substrate 1 in a circular shape as viewed from the above. A silicon wafer 9 is placed on the electrostatic chuck 101, which is grounded.

Since a ceramic layer which is formed on this electrostatic electrode layer so as to cover the electrostatic electrode layer, functions as a dielectric film for adsorbing a silicon wafer, it will be referred to a ceramic dielectric film 4, hereinafter.

As illustrated in FIG. 2, the chuck positive electrostatic layer 2 comprises a semicircular arc part 2a and a comb teeth-shaped part 2b and the chuck negative electrostatic layer 3 similarly comprises a semicircular arc part 3a and a comb teeth-shaped part 3b. These chuck positive electrostatic layer 2 and chuck negative electrostatic layer 3 are arranged opposite to each other so that the comb-teeth-shaped parts 2b and 3b cross each other. The+side and the−side of a direct power source are connected to the chuck positive electrostatic layer 2 and chuck negative electrostatic layer 3, respectively. Thus, a direct current $V_2$ is applied thereto.

In order to control the temperature of a silicon wafer 9, resistance heating elements 5 in a concentric configuration as viewed from the above are disposed inside the ceramic substrate 1, and external terminal pins 6 are connected and fixed to both ends of each of the resistance heating elements 5 so that a voltage $V_1$ can be applied. Although not shown in FIGS. 1,2, in the ceramic substrate 1, bottomed holes 11 in which temperature measuring devices are inserted; and through holes 12 through which lifter pins (not shown) for supporting and moving up and down a silicon wafer 9 are inserted, are formed. The resistance heating elements 5 may also be disposed on the bottom face of the ceramic substrate. The ceramic substrate 1 may have an RF electrode embedded therein based on the necessity.

When the electrostatic chuck 101 is caused to function, a direct voltage $V_2$ is applied between the chuck positive electrostatic layer 2 and the chuck negative electrostatic layer 3. Thus, a silicon wafer 9 is adsorbed to be fixed to these electrodes through a ceramic dielectric film 4 by the electrostatic action of the chuck positive electrostatic layer 2 and the chuck negative electrostatic layer 3. After fixing the silicon wafer 9 to an electrostatic chuck 101 in this manner, the silicon wafer 9 is subjected to various treatments such as CVD and the like.

The above electrostatic chuck is equipped with electrostatic electrode layers and resistance heating elements and has a structure, for example, shown in FIGS. 1 to 3. Hereinafter, among the parts constituting the above-mentioned electrostatic chuck, parts which have not been described in the description on the above-mentioned ceramic substrate will be explained.

A ceramic dielectric film 4 on the electrostatic electrodes is desirably made of the same material as the other parts of the ceramic substrate because a green sheet and the like can be manufactured in the same process and a ceramic substrate can be manufactured via a single sintering operation after laminating those sheets.

It is desirable that the above-mentioned ceramic dielectric film, like the other portions of the ceramic substrate, contains carbon since an electrostatic electrode can be hidden and radiation heat can be utilized.

The above-mentioned ceramic dielectric film desirably contains an alkali metal oxide, an alkaline earth metal oxide or a rare-earth oxide because these serve as a sintering aid and the like, resulting information of a high-density dielectric film.

The thickness of the above-mentioned ceramic dielectric film is desirably 50 to 5000 $\mu$m. This is because of the following reasons: if the ceramic dielectric film has a thickness less than 50 $\mu$m, the film is too thin to obtain a sufficient breakdown voltage and the ceramic dielectric film may have a dielectric breakdown when a silicon wafer is placed and adsorbed; and if the thickness of the above-mentioned ceramic dielectric film exceeds 5000 $\mu$m, a long distance between a silicon wafer and an electrostatic electrode lowers the ability of adsorbing the silicon wafer. The thickness of the ceramic dielectric film is more desirably 100 to 1500 $\mu$m.

Examples of the electrostatic electrode formed inside the ceramic substrate include sintered bodies of metal or conductive ceramic and metal foils. Desirable metal sintered body is those made of at least one selected from tungsten and molybdenum. The metal foils are also desirable to be made of the same material as the metal sintered body. This is because these metals are hard to be oxidized and have sufficient conductivities as an electrode. As a conductive ceramic, at least one selected from carbides of: tungsten; and molybdenum can be employed.

Figure 4:
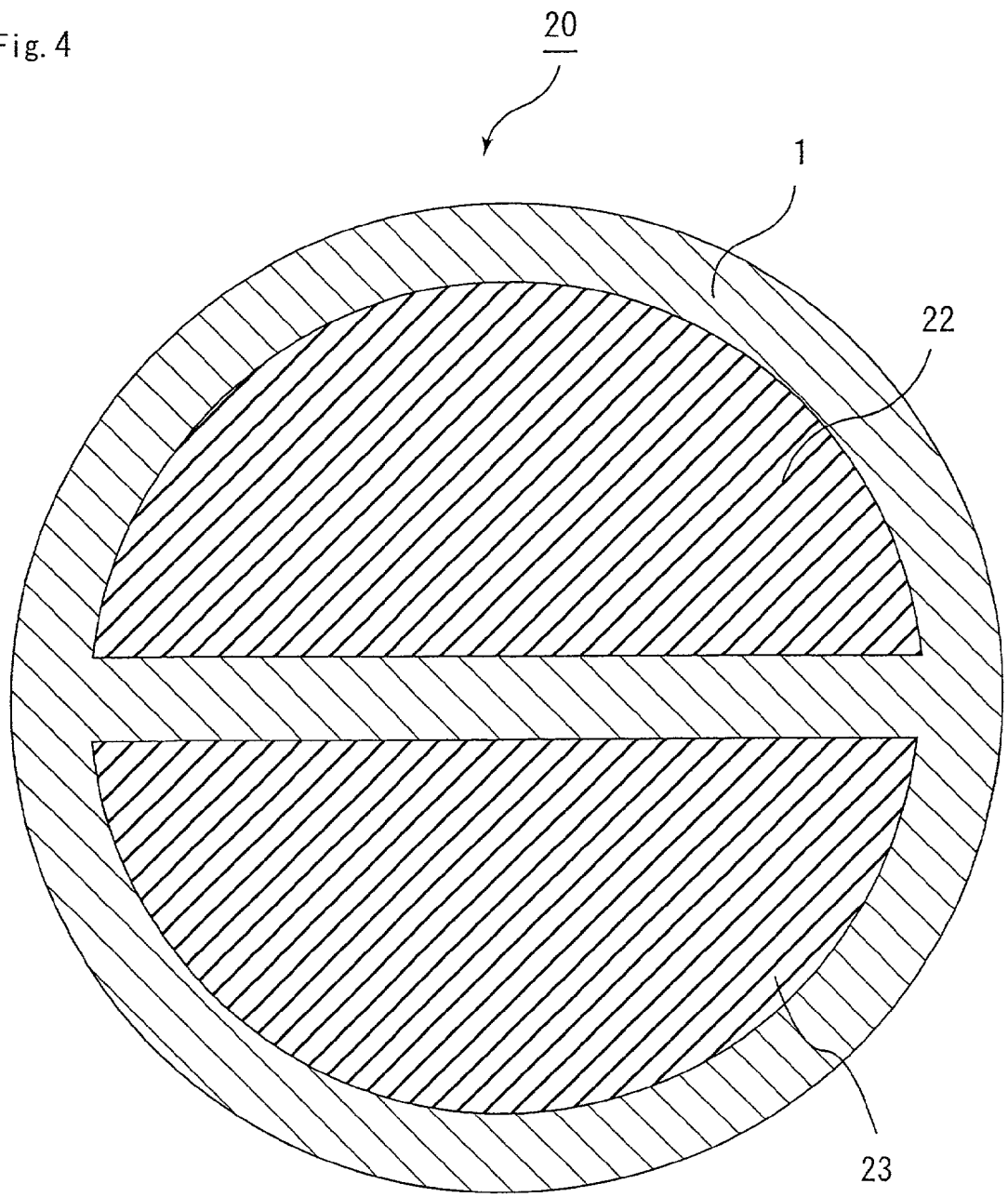
FIG. 4 is a sectional view schematically showing an example of an electrostatic electrode of an electrostatic chuck.
Figure 5:
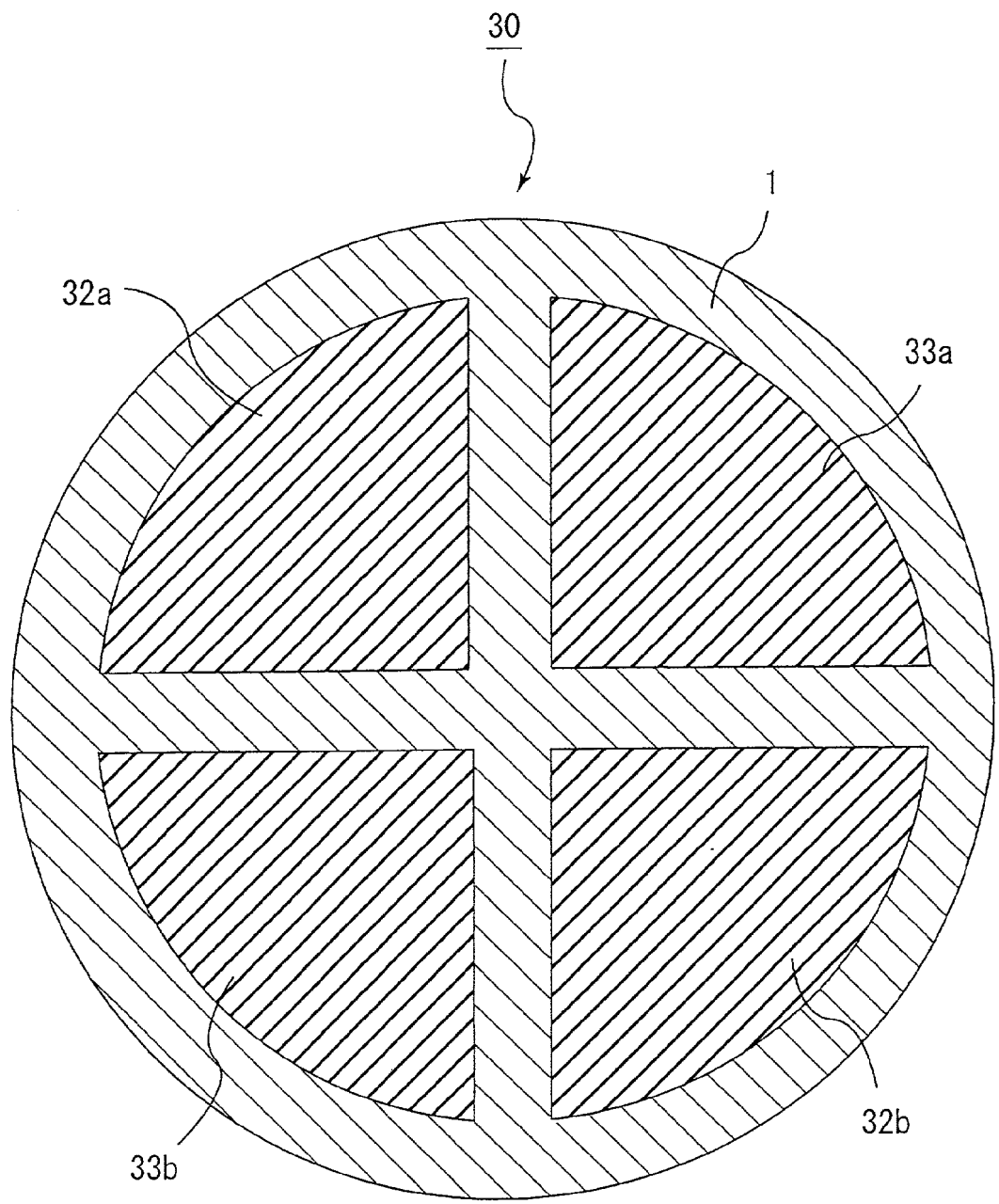
FIG. 5 is a sectional view schematically showing an example of an electrostatic electrode of an electrostatic chuck.

FIGS. 4,5 are horizontal sectional views schematically illustrating electrostatic electrodes in other electrostatic chucks. In the electrostatic chuck 20 shown in FIG. 4, a chuck positive electrostatic layer 22 and a chuck negative electrostatic layer 23, both being in a semicircular shape, are formed inside the ceramic substrate 1. In the electrostatic chuck illustrated in FIG. 5, are arranged chuck positive electrostatic layers 32a, 32b and chuck negative electrostatic layers 33a, 33b, both types of layers having a shape obtained by dividing a circular shape in four. Two positive electrostatic layers 22a, 22b and two negative electrostatic layers 33a and 33b are formed so as to cross each other.

When forming electrodes in a shape obtained by dividing an electrode having a circular shape and the like, the number of divided pieces is not particularly limited and may be 5 or more. The shape of the electrode is also not limited to a sector form.

A resistance heating element maybe formed inside a ceramic substrate as illustrated in FIG. 1, and may also be disposed on the bottom face of the ceramic substrate. When a resistance heating element is disposed, a supporting case into which an electrostatic chuck is fitted may be provided with an inlet for blowing a coolant, such as the air, as cooling means.

Examples of resistance heating elements include sintered body made of metal or conductive ceramic, metal foils and metal wires and the like. As the metal sintered body, at least one selected from tungsten and molybdenum is desirable because these metals are relatively hard to be oxidized and have resistivities sufficient to generate heat.

As the conductive ceramic, at least one selected from carbides of: tungsten; and molybdenum can be employed.

Furthermore, when a resistance heating element is formed on the bottom face of a ceramic substrate, it is desirable to use noble metal (gold, silver, palladium, platinum) or nickel as the sintered body. Specifically, silver, silver-palladium and the like can be used.

As metal particles to be used for the above-mentioned metal sintered body, those of a spherical shape, those of a scaly shape, and mixtures of those of a spherical shape and those of a scaly shape can be used.

A metal oxide may be added in the metal sintered body. The purpose of using the above-mentioned metal oxide is to let a ceramic substrate adhere to metal particles firmly. The reason of the improvement in the adhesion between a ceramic substrate and metal particles is not clear, but would be as follows: an oxide film is slightly formed on the surface of the metal particles and an oxide film is formed on the surface of the ceramic substrate in the case that the ceramic substrate is made of a non-oxide ceramic as well as an oxide ceramic. It can be therefore considered that these oxide films are sintered and integrated with each other, through the metal oxide, on the surface of the ceramic substrate so that the metal particles and the ceramic substrate adhere closely to each other.

As the above metal oxide, for example, at least one selected from lead oxide, zinc oxide, silica, boron oxide ($B_2O_3$), alumina, yttria and titania is desirable because these oxides can improve the adhesiveness between metal particles and a ceramic substrate without increasing the resistivity of a resistance heating element.

The amount of the metal oxide is desirably 0.1 part by weight or more and less than 10 parts by weight per 100 parts by weight of metal particles because the use of a metal oxide in this range can improve the adhesiveness between metal particles and a ceramic substrate without too much increase of resistivity.

The rates of lead oxide, zinc oxide, silica, boron oxide ($B_2O_3$), alumina, yttria and titania, based on 100 parts by weight of the whole amount of the metal oxides, are preferably 1 to 10 parts by weight for lead oxide, 1 to 30 parts by weight for silica, 5 to 50 parts by weight for boron oxide, 20 to 70 parts by weight for zinc oxide, 1 to 10 parts by weight for alumina, 1 to 50 parts by weight for yttria and 1 to 50 parts by weight for titania. The ratio is preferably adjusted within the scope that the total amount of these oxides is not over 100 parts by weight. This is because these ranges are particularly those where the adhesion to a ceramic substrate can be improved.

When a resistance heating element is disposed on the bottom face of a ceramic substrate, it is desirable that a surface of the resistance heating element is covered with a metal layer. The resistance heating element is a sintered body of metal particles. Hence, if it is exposed, it is oxidized easily and the oxidization thereof results in a change in the resistivity. Then, such oxidation can be prevented by covering the surface with a metal layer.

A desirable thickness of the metal layer is 0.1 to 10 $\mu$m because this is the range where the oxidation of a resistance heating element can be prevented without a change in the resistivity of the resistance heating element.

The metal used for the covering may be any non-oxidizable metal. Specifically, at least one kind of metal selected from gold, silver, palladium, platinum and nickel is desirable. Among them, nickel is more desirable because a resistance heating element is required to have a terminal for the connection to a power supply, the terminal being attached to the resistance heating element through a solder, and nickel can prevent thermal diffusion of the solder. As a connection terminal, a terminal pin made of Kovar can be employed.

It is to be noted that when a resistance heating element is formed inside a heater plate, the covering is not required because the surface of the resistance heating element is never oxidized. When a resistance heating element is formed inside a heater plate, a part of the surface of the resistance heating element may be exposed.

A desirable metal foil to be used as a resistance heating element is those formed as resistance heating elements by pattern formation through, for example, etching a nickel foil and a stainless steel foil. The patterned metal foil may also be put together with a resin film and the like. Examples of the metal wire include a tungsten wire and a molybdenum wire.

When a conductor is formed on the surface and inside the ceramic substrate of the present invention and the above internal conductor is at least one of a guard electrode or a ground electrode, the above-mentioned ceramic substrate functions as a wafer prober.

Figure 6:
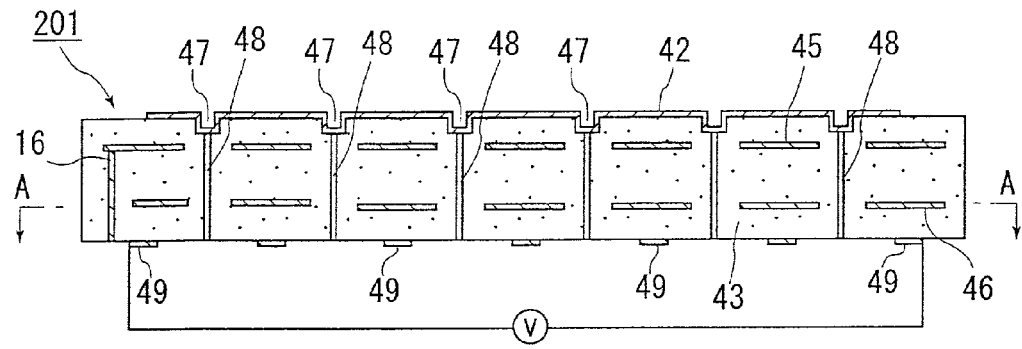
FIG. 6 is a sectional view schematically showing a wafer prober that is an embodiment of a ceramic substrate of the present invention.
Figure 7:
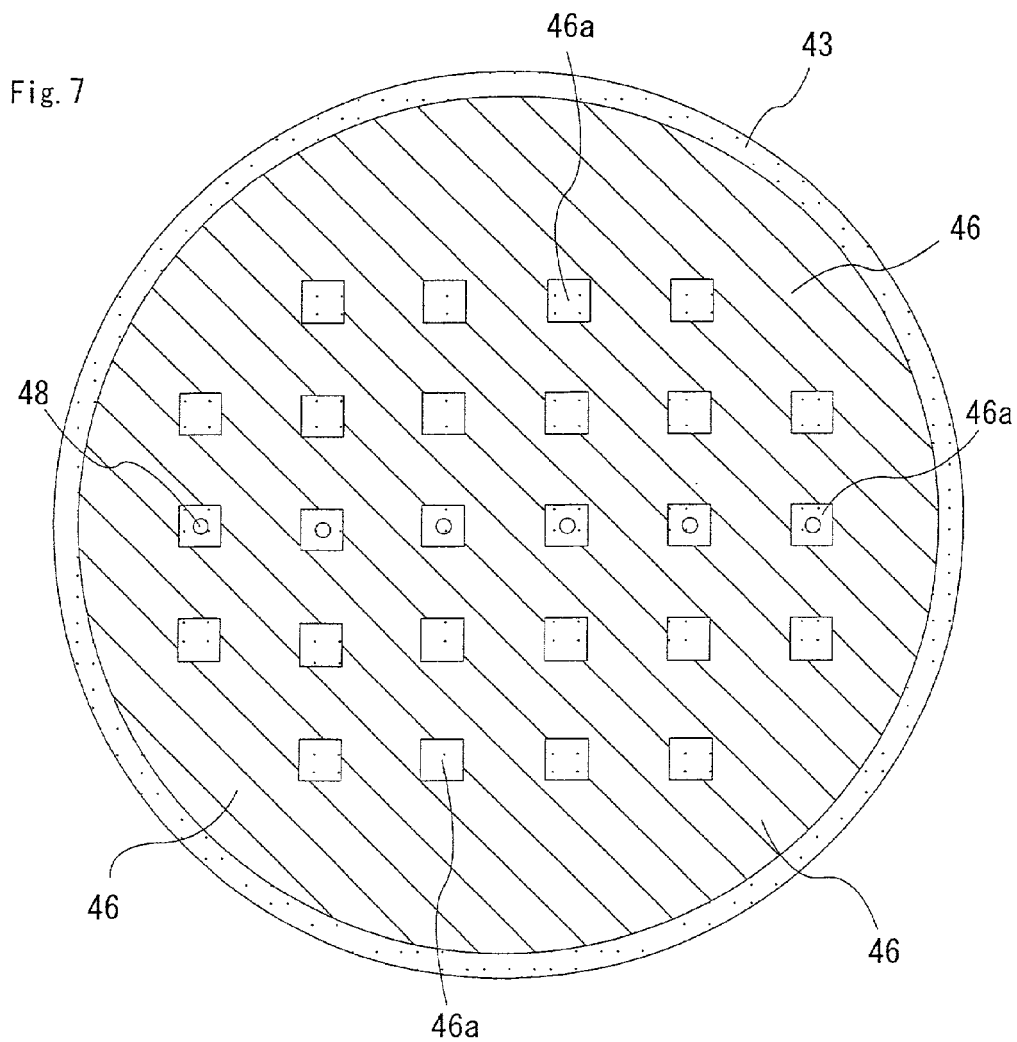
FIG. 7 is an A—A line sectional view in the wafer prober shown in FIG. 6.

FIG. 6 is a sectional view schematically showing an embodiment of the wafer prober of the present invention. FIG. 7 is a sectional view of the wafer prober illustrated in FIG. 6 taken along the A—A line.

In this wafer prober 201, grooves 47 in a concentric configuration as viewed from the above are formed in the surface of a ceramic substrate 43 in a circular form as viewed from the above and a plurality of suction holes 48 for sucking a silicon wafer are provided in a part of the grooves 47. A chuck top conductor layer 42 for connecting to an electrode of a silicon wafer is formed, in a circular form, in a greater part of the ceramic substrate 43 including the grooves 47.

On the other hand, on the bottom face of the ceramic substrate 43, a heating elements 49 in a concentric configuration as viewed from the above as shown in FIG. 3 are disposed in order to control the temperature of a silicon wafer. To both ends of each of the heating elements 49, external terminal pins (not shown) are connected and fixed.

Moreover, a guard electrode 45 and a ground electrode 46 (reference to FIG. 7), both being in a lattice form as viewed from the above, are arranged inside the ceramic substrate 43 in order to remove a stray capacitor and noise. The materials of the guard electrodes 45 and ground electrodes 46 may be the same as those of the electrostatic electrodes.

The thickness of the above-mentioned chuck top conductor layer 42 is desirably 1 to 20 μm because if it is less than 1 μm, the resistivity is too high for the layer to work as an electrode and, on the other hand, if it exceeds 20 μm, the layer becomes easier to exfoliate due to the stress that the conductor has.

As the chuck top conductor layer 42, at least one kind of metal selected from high-melting point metals such as copper, titanium, chromium, nickel, noble metals (gold, silver, platinum and the like), tungsten and molybdenum can be employed.

As for a wafer prober having such a structure, a continuity test can be performed by placing, on the wafer prober, a silicon wafer having an integrated circuit formed thereon, pressing a probe card having a tester pin against the silicon wafer and applying a voltage while heating and cooling.

Next, a manufacturing method of the ceramic substrate of the present invention will be explained with reference to the sectional views shown in FIGS. 8(a) to (d) by taking a manufacturing method of an electrostatic chuck as an example.

(1) First, a green sheet 50 is made by preparing a mixed composition by mixing a powder of ceramic such as oxide ceramic, nitride ceramic and carbide ceramic with a binder and a solvent and thereafter shaping the composition. When incorporating carbon into the composition, the above-mentioned crystalline carbon or amorphous carbon is used and the amount thereof is controlled depending upon the desired characteristics.

As the ceramic powder, for example, aluminum nitride, silicon carbide and the like can be used. A sintering aid such as yttria may be added based on the necessity.

When an amorphous carbon is used as carbon, it is desirable to produce the amorphous carbon in advance, but it is also possible that a material that will change to amorphous carbon is mixed in a green sheet. For example, pure amorphous carbon can be produced by firing a hydrocarbon made up only of C, H and O, preferably a saccharide (sucrose or cellulose), in the air at 300 to 500° C. As a crystalline carbon, pulverized crystalline carbon black or graphite, which are crystalline, can be employed.

Several or one green sheet 50 which will be laminated on a green sheet on which the electrostatic electrode printed element 51 has been formed, described later, is a layer that will become a ceramic dielectric film. The composition thereof, therefore, maybe a composition different from that of the ceramic substrate, depending upon the purpose and the like.

Moreover, it is also possible that a ceramic substrate is manufactured first, an electrostatic electrode layer is thereafter formed thereon, and a ceramic dielectric film is formed further thereon.

As a binder, at least one selected from acrylic binders, ethylcellulose, butyl cellosolve and polyvinyl alcohol is desirable.

Furthermore, as a solvent, at least one selected from α-terpineol and glycol is desirable.

A green sheet 50 is made by shaping the paste obtained by mixing these materials into a sheet form by a doctor blade method.

To the green sheet 50, a through hole in which a lifter pin for a silicon wafer will be inserted or a concave portion in which a thermocouple will be buried may also be formed based on the necessity. The through hole or the concave portion may be formed by punching and the like.

The thickness of the green sheet 50 is desirably about 0.1 to 5 mm.

(2) Subsequently, a conductor containing paste that will become an electrostatic electrode layer or a resistance heating element is printed to the green sheet 50.

The printing is performed in order that a desired aspect ratio is obtained, by considering a shrinkage ratio of the green sheet 50. By this operation, an electrostatic electrode layer printed element 51 and a resistance heating element layer printed element 52 are obtained.

The printed elements are formed by printing a conductor containing paste containing a conductive ceramic, metal particles and the like.

As the conductive ceramic particles contained in these conductor containing pastes, carbides of: tungsten; or molybdenum is the most suitable since they are hard to be oxidized and their conductivity does not drop easily.

As the metal particles, for example, tungsten, molybdenum, platinum and nickel can be employed.

The conductive ceramic particles and the metal particles desirably have an average particle diameter of 0.1 to 5 μm because if these particles are too large or too small, it is difficult to print the conductor containing paste.

As such a paste, a conductor containing paste which is prepared by mixing 85 to 97 parts by weight of metal particles or conductive ceramic particles, 1.5 to 10 parts by weight of at least one kind of binder selected from acrylic binders, ethylcellulose, butyl cellosolve and polyvinyl alcohol and 1.5 to 10 parts by weight of at least one kind of solvent selected from α-terpineol, glycol, ethylalcohol and butanol is most suitable.

Furthermore, conductor-filled through hole printed elements 53, 54 are obtained by filling the holes formed by punching and the like with the conductor containing paste.

(3) Next, as illustrated in FIG. 8(a), a green sheet 50 with printed elements 51, 52, 53, 54 and a green sheet 50 with no printed element are laminated. On the green sheet on which an electrostatic electrode printed element 51 has been formed, several or one green sheet 50 is laminated. The purpose of laminating a green sheet 50 having no printed element on the face where a resistance heating element is formed is to prevent the trouble that an end surface of a conductor-filled through hole is exposed and oxidized during the sintering for forming a resistance heating element. If the sintering for forming a resistance heating element is performed with the end surface of the conductor-filled through hole exposed, there is a necessity of sputtering with metal which are hard to be oxidized, such as nickel. More desirably, it may also be covered with an Au—Ni gold solder.

(4) Next, as illustrated in FIG. 8(b), the green sheet and the conductor containing paste are sintered by heating and pressurizing the lamination. The heating temperature is desirably 1000 to 2000° C. and the pressure is desirably 100 to 200 kg/cm². The heating and pressurizing are performed in an inert gas atmosphere. As the inert gas, argon, nitrogen and the like can be employed. In this step, conductor-filled through holes 16, 17, a chuck positive electrostatic layer 2, a chuck negative electrostatic layer 3, a resistance heating element 5 and so on, are formed.

(5) Next, as illustrated in FIG. 8(c), blind holes 13, 14 for connecting external terminals are formed.

It is favorable that at least a part of the inner walls of the blind holes 13, 14 is made conductive and the inner walls which have been made conductive are connected with a chuck positive electrostatic layer 2, chuck negative electrostatic layer 3, resistance heating element 5, and so on.

(6) Finally, as illustrated in FIG. 8(d), external terminals 6, 18 are attached to the blind holes 13, 14 through a gold solder. Moreover, based on the necessity, a bottomed hole 12 may be formed, into which a thermocouple is buried.

Alloy such as silver-lead, lead-tin and bismuth-tin can be used as a solder.

The thickness of the solder layer is desirably 0.1 to 50 µm because this is the range sufficient to keep a connection with a solder.

An electrostatic chuck 101 (reference to FIG. 1) was taken as an example in the above explanation. When manufacturing a wafer prober, a ceramic substrate with a resistance heating element embedded therein can be manufactured first, as in the case of electrostatic chucks, thereafter a groove in the surface of the ceramic substrate is formed thereon, and then a metal layer can be formed by conducting sputtering, plating and the like to the surface portion where the groove has been formed.

Best Mode for Carrying out the Invention

The present invention will be described in more detail below.

EXAMPLES 1 TO 3

Figure 9:
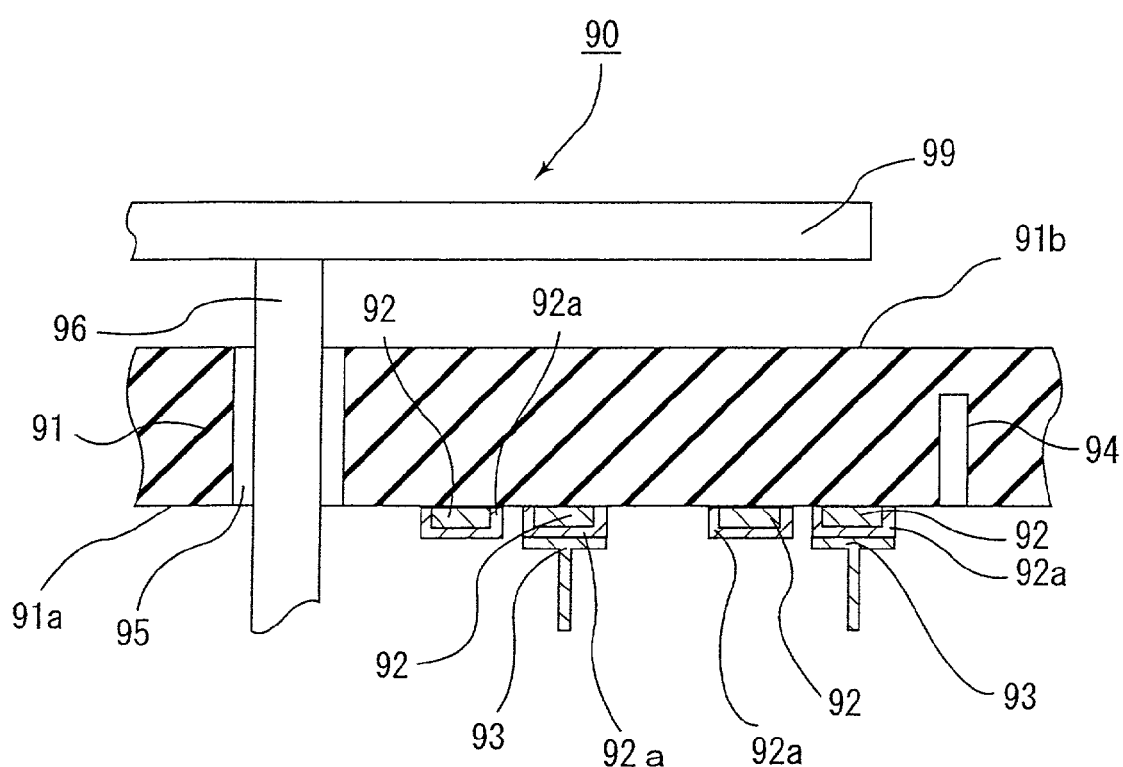
FIG. 9 is a sectional view schematically showing a hot plate that is an embodiment of a ceramic substrate of the present invention.

Hot Plate (Reference to FIG. 9)

(1) An aluminum nitride sintered body was obtained by: mixing 100 parts by weight of aluminum nitride powder (manufactured by Tokuyama Corp., average particle diameter 1.1 µm) which is fired in the air at 500° C. for one hour, 4 parts by weight of yttrium oxide ($Y_2O_3$: yttria, average particle diameter 0.4 µm) and 11.5 parts by weight of acrylic resin binder; putting the mixture into a hexagonal columnar mold; and then hot pressing it in a nitrogen atmosphere under the conditions: at a temperature of 1890° C. and a pressure of 150 kg/cm$^2$ for three hours. Ceramic substrates having, respectively, a diameter of 280 mm and a thickness of 19 mm (Example 1), a diameter of 310 mm and a thickness of 5 mm (Example 2) and a diameter of 350 mm and a thickness of 3 mm (Example 3) were obtained by processing the above aluminum nitride sintered body into disk shapes and varying a surface grinding amount.

(2) A conductor containing paste was printed on the bottom face 91a of the ceramic substrate 91 obtained in the above (1) by screen printing. The printed pattern was that in a concentric configuration shown in FIG. 3.

As the conductor containing paste, Solbest PS603D manufactured by Tokuriki Kagaku Kenkyusho. CO, which has been used for the formation of plated through holes in printed circuit boards, was used.

This conductor containing paste was a silver-lead paste and contained 7.5 parts by weight, per 100 parts by weight of silver, of metal oxides comprising lead oxide (5% by weight) zinc oxide (55% by weight), silica (10% by weight), boron oxide (25% by weight) and alumina (5% by weight). The silver powder had an average particle diameter of 4.5 µm and was in a scaly shape.

(3) Next, a resistance heating element 92 was formed by heating and firing the sintered body printed with the conductor containing paste at 780° C., thereby sinter the silver and the lead in the conductor containing paste and baking them to the ceramic substrate 91. The silver-lead resistance heating element 92 had a thickness of 5 µm, a width of 2.4 mm and a volume resistivity of 7.7 mΩ/□.

(4) A metal covering layer 92a (a nickel layer) 1 µm in thickness was deposited on the surface of the silver-lead heating element 92 by immersing the sintered body prepared in the above (4) in an electroless nickel plating bath comprising an aqueous solution containing 80 g/L of nickel sulfate, 24 g/L of sodium hypophosphite, 12 g/L of sodium acetate, 8 g/L of boric acid and 6 g/L of ammonium chloride.

(5) A solder layer was formed by printing a silver-lead solder paste (manufactured by Tanaka Kikinzoku Kogyo CO.) by screen printing in a portion to which a terminal for securing the connection with a power supply will be attached. Subsequently, by placing a terminal pin 93 made of Kovar on the solder layer and heating and reflowing at 420° C., the terminal pin 93 was attached to a surface of the heating element 92 (the metal covering layer 92a).

(6) Then, a ceramic heater 90 (reference to FIG. 9) was obtained by inserting a thermocouple for temperature control in a bottomed hole 94, filling with a polyimide resin and curing it at 190° C. for 2 hours.

TEST EXAMPLES 1 TO 3

Hot plates were manufactured in the same manner as Example 1 except that they are adjusted to have a diameter of 240 mm and a thickness of 5 mm (Test example 1); a diameter of 310 mm and a thickness of 30 mm (Test example 2); and a diameter of 300 mm and a thickness of 17 mm without adding any $Y_2O_3$ (Test example 3). In Test example 3, a metal foil serving as a resistance heating element was embedded in the mold and a formed position of the heating element was adjusted to the position 33% apart from the back face.

TEST EXAMPLES 4 TO 6

Hot plates were manufactured in the same manner as Example 1 except that they are provided with no heating element and adjusted to have a diameter of 240 mm and a thickness of 5 mm (Test example 4) a diameter of 310 mm and a thickness of 30 mm (Test example 5); and a diameter of 300 mm and a thickness of 17 mm (Test example 6).

As for the hot plates according to the above-mentioned Examples 1 to 3 and Test examples 1 to 6, a warp amount at 450° C., a temperature rise time, temperature uniformity of a surface and an oxygen amount were examined in the manner described below. It is to be noted that for the hot plates of Test examples 4 to 6, only the warp amount was examined. The results are shown in the table. 1.

EXAMPLES 4 TO 6

Alumina Hot Plate (1) Green sheets 50, which were 0.47 mm in thickness, were obtained: by using a paste containing alumina:93% by weight, $SiO_2$:5% by weight, CaO:0.5% by weight, MgO: 0.5% by weight, $TiO_2$:0.5% by weight, an acrylic binder: 11.5 parts by weight, a dispersant: 0.5 part by weight and 53 parts by weight of alcohol comprising 1-butanol and ethanol; and forming it by a doctor blade method.

(2) Subsequently, after drying these green sheets at 80° C. for 5 hours, to the green sheets having a necessity of being processed, portions which will become through holes, in which lifter pins for a semiconductor wafer, 1.8 mm, 3.0 mm and 5.0 mm in diameter, respectively, and portions which will become conductor-filled through holes for being connected with external terminals were formed by punching.

(3) Conductor containing paste B was prepared by mixing 100 parts by weight of tungsten particle having an average particle diameter of 3 μm, 1.9 parts by weight of an acrylic binder, 3.7 parts by weight of α-terpineol solvent and 0.2 part by weight of a dispersant.

A conductor containing paste layer was formed by printing this conductor containing paste B to the green sheets 50 by screen printing. The printed pattern was a pattern in a concentric configuration.

(4) Furthermore, conductor containing paste B was filled in the through hole for conductor-filled through holes for being connected with external terminals.

On the green sheets 50 with a pattern of a resistance heating element formed thereon, 34 to 60 sheets of green sheets 50 with no conductor containing paste printed were stacked on their top side (the heating face); and the same 13 to 30 green sheets were stacked on their bottom side. Then, the resultant was pressed at a temperature of 130° C. and a pressure of 80 kg/cm$^2$ to form a lamination (FIG. 8(a)). The heating element-formed positions are shown in Table 2.

(5) Next, alumina plates of 3 mm in thickness were obtained by degreasing the obtained lamination at 600° C. for 5 hours and hot pressing them at 1600° C. at a pressure of 150 kg/cm$^2$ for 2 hours. By varying the processing conditions and grinding conditions, ceramic substrates made of alumina having a diameter of 280 mm and a thickness of 19 mm (Example 4), a diameter of 310 mm and a thickness of 5 mm (Example 5), and a diameter of 350 mm and a thickness of 3 mm (Example 6), respectively, were obtained. These ceramic substrates had resistance heating elements 5 having a thickness of 6 μm and a width of 10 mm therein.

(6) Subsequently, after the grinding of the plates obtained in (5) with a diamond grind stone, masks were placed on the bodies, and bottomed holes (diameter:1.2 mm, depth:2.0 mm) for a thermocouple were formed on their surfaces by blast treatment with SiC and the like.

(7) Furthermore, blind holes 13, 14 were formed by hollowing out the portions where the conductor-filled through holes were made (FIG. 8(c)), and external terminals 6, 18 made of Kovar were connected to the blind holes 13, 14 by heating and reflowing using gold solder comprising Ni—Au (FIG. 8(d)) at 700° C. It is to be noted that the connection of the external terminals desirably has a structure wherein a support of tungsten supports at three points since connection reliability can be secured.

(8) Next, a plurality of thermocouples for temperature control were buried in the bottomed holes. Thus, the manufacturing of the hot plates with resistance heating elements was completed.

TEST EXAMPLES 7 TO 9

Ceramic substrates were manufactured in the same manner as Examples 4 to 6 except that they are adjusted to have a diameter of 240 mm and a thickness of 5 mm (Test example 7); a diameter of 310 mm and a thickness of 30 mm (Test example 8); and a diameter of 300 mm and a thickness of 17 mm using aluminum nitride without containing any Y$_2$O$_3$ (Test example 9). The heating element-formed positions are shown in Table 2.

TEST EXAMPLES 10 TO 12

Hot plates were manufactured in the same manner as Examples 4 to 6 except they are provided with no heating element and adjusted to a diameter of 240 mm and a thickness of 5 mm (Test example 10); a diameter of 310 mm and a thickness of 30 mm (Test example 11); and a diameter of 300 mm and a thickness of 17 mm (Test example 12).

TEST EXAMPLE 13

A hot plate was manufactured in the same manner as Example 5 except laminating 20 sheets of green sheets 50 on the top side (heating face) and 19 sheets on the bottom side.

TEST EXAMPLE 14

A hot plate was manufactured in the same manner as Example 5 except laminating 10 sheets of green sheets 50 on the top side (the heating face) and 29 sheets on the bottom side.

As for the hot plates of the above-mentioned Examples 4 to 6 and Test examples 7 to 14, a warp amount at 450° C., a temperature rise time and temperature uniformity of a surface were examined in the manner described below. It is to be noted that for the hot plates of Test examples 10 to 12, only the warp amount was examined. The results are shown in Table 2.

EXAMPLES 7 TO 9

Manufacture of Electrostatic Chucks Made of AlN with Heaters (FIGS. 1 to 3)

(1) Next, green sheets 50, which were 0.47 mm in thickness, were obtained by: using a paste prepared by mixing 100 parts by weight of aluminum nitride powder (manufactured by Tokuyama Corp., average particle diameter 1.1 μm) fired in the air at 500° C. for one hour, 1,2, 4 parts by weight of yttria (average particle diameter 0.4 μm), 11.5 parts by weight of acrylic binder, 0.5 part by weight of a dispersant and 53 parts by weight of alcohol comprising 1-butanol and ethanol; and forming it by a doctor blade method.

(2) Subsequently, after drying these green sheets 50 at 80° C. for 5 hours, to the green sheets having a necessity of being processed, portions which will become through holes, in which lifter pins for a semiconductor, 1.8 mm, 3.0 mm and 5.0 mm in diameter, respectively, and portions which will become conductor-filled through holes for being connected with external terminals were formed by punching.

(3) Conductor containing paste A was prepared by mixing 100 parts by weight of tungsten carbide particle having an average particle diameter of 1 μm, 3.0 parts by weight of an acrylic binder, 3.5 parts by weight of α-terpineol solvent and 0.3 part by weight of a dispersant.

Conductor containing paste B was prepared by mixing 100 parts by weight of tungsten particle having an average particle diameter of 3 μm, 1.9 parts by weight of an acrylic binder, 3.7 parts by weight of α-terpineol solvent and 0.2 part by weight of a dispersant.

A conductor containing paste layer was formed by printing this conductor containing paste A to the green sheets 50 by screen printing. The printed pattern was a pattern in a concentric configuration. Moreover, on another green sheet 50, a conductor containing paste layer having an electrostatic electrode pattern with a shape shown in FIG. 2 was formed.

(4) Furthermore, conductor containing paste B was filled in the through hole for conductor-filled through holes for being connected with external terminals.

On the green sheets 50 with a pattern of a resistance heating element formed thereon, 34 to 60 sheets of green sheets 50 with no conductor containing paste printed were stacked on their top side (the heating face); and the same 13 to 30 green sheets were stacked on their bottom side. Then, the resultant was pressed at a temperature of 130° C. and a pressure of 80 kg/cm$^2$ to form a lamination (FIG. 8(*a*)). The heating element-formed positions are shown in Table 2.

(5) Next, the resulting laminations were processed to substrates, respectively, having a diameter of 280 mm and a thickness of 19 mm (Example 7), a diameter of 310 mm and a thickness of 5 mm (Example 8) and a diameter of 350 mm and a thickness of 3 mm (Example 9) under nitrogen gas by degreasing the laminations at 600° C. for 5 hours, hot pressing them at 1890° C. at a pressure of 150 kg/cm$^2$ for 3 hours and varying the processing conditions and grinding conditions. Thus, plates made of aluminum nitride were obtained, which had therein resistance heating elements 5 having a thickness of 6 μm and a width of 10 mm and a chuck positive electrostatic layer 2 and a chuck negative electrostatic layer 3, each layer being 10 μm in thickness (FIG. 8(*b*)). The heating element-formed positions are shown in Table 3.

(6) Subsequently, after the grinding of the plate obtained in (5) with a diamond grind stone, a mask was placed on the body and a bottomed hole (diameter:1.2 mm, depth:2.0 mm) for a thermocouple was formed in its surface by blast treatment with SiC and the like.

Figure 8:
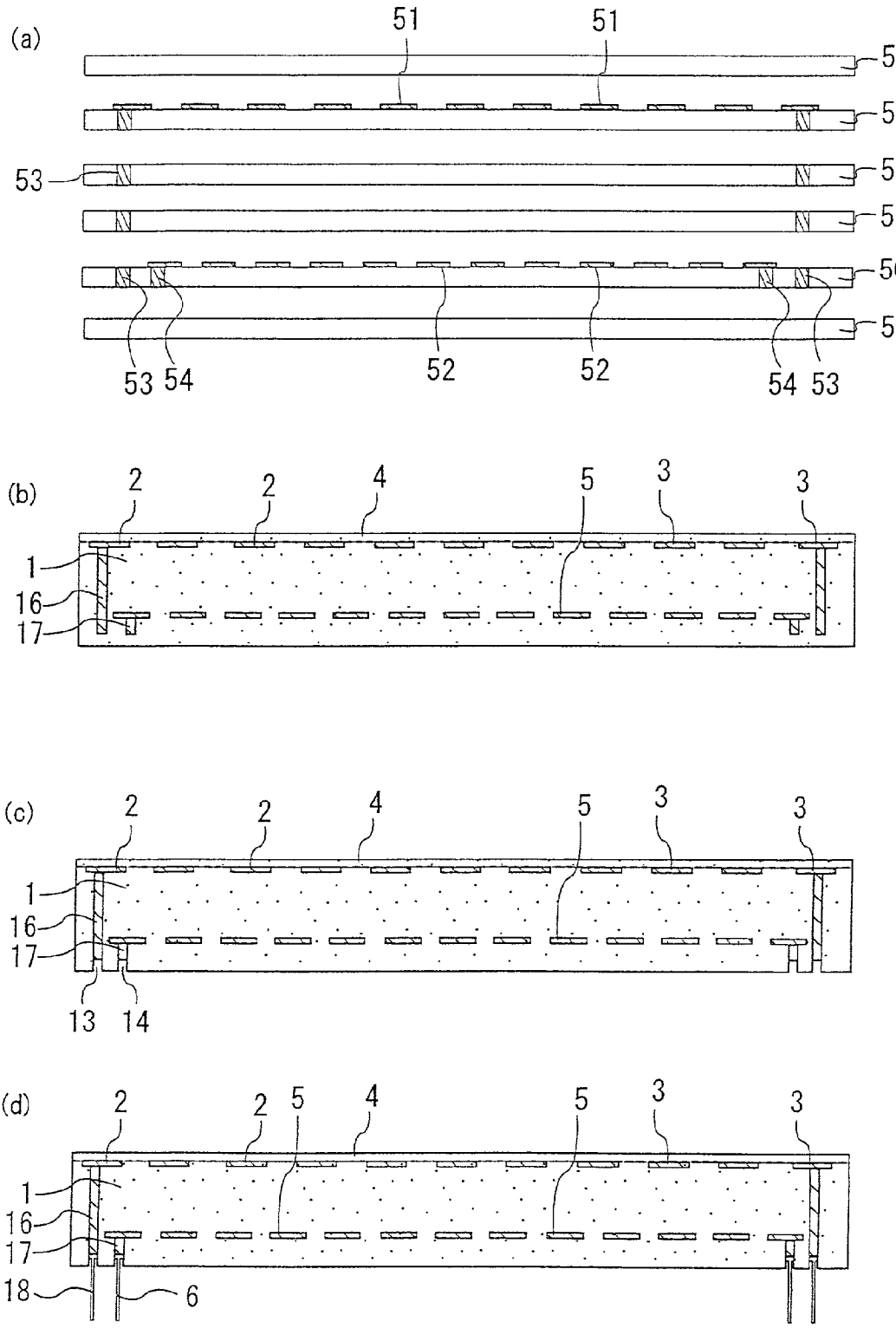
In FIG. 8, (a) to (d) are sectional views schematically showing a part of the manufacture process of an electrostatic chuck.

(7) Furthermore, blind holes 13, 14 were formed by hollowing out the portions where the conductor-filled through holes were made (FIG. 8(*c*)) and external terminals 6, 18 made of Kovar were connected to the blind holes 13, 14 by heating and reflowing using gold solder comprising Ni—Au (FIG. 8(*d*)) at 700° C. It is to be noted that the connection of the external terminals desirably has a structure, wherein a support of tungsten supports at three points, since connection reliability can be secured.

(8) Next, a plurality of thermocouples for temperature control were buried in the bottomed holes. Thus, the manufacture of the electrostatic chucks with resistance heating elements was completed.

TEST EXAMPLES 15 TO 17

Ceramic substrates were manufactured in the same manner as Examples 7 to 9 except that they are adjusted to have a diameter of 240 mm and a thickness to 5 mm (Test example 15); a diameter of 310 mm and a thickness of 30 mm (Test example 16); and a diameter of 300 mm and a thickness of 17 mm without adding any Y$_2$O$_3$ (Test example 17).

TEST EXAMPLES 18 TO 20

Ceramic substrates were manufactured in the same manner as Examples 7 to 9 except that they are provided with no heating element and adjusted to have a diameter of 240 mm and a thickness of 5 mm (Test example 18); a diameter of 310 mm and a thickness of 30 mm (Test example 19); and a diameter of 300 mm and a thickness of 17 mm (Test example 20).

TEST EXAMPLE 21

Ceramic substrates were manufactured in the same manner as in Examples 7 to 9 except laminating 20 sheets of green sheets 50 on the top side (the heating face) and 19 sheets on the bottom side.

TEST EXAMPLE 22

Ceramic substrates were manufactured in the same manner as Examples 7 to 9 except laminating 10 sheets of green sheets 50 on the top side (the heating face) and 29 sheets on the bottom side.

TEST EXAMPLE 23

A ceramic substrate was manufactured in the same manner as Example 8 except adding no yttria to aluminum nitride.

TEST EXAMPLE 24

A ceramic substrate was manufactured in the same manner as Example 8 except adding 40 parts by weight of yttria to aluminum nitride.

As for the electrostatic chucks of the above-mentioned Examples 7 to 9 and Test examples 15 to 24, a warp amount at 450° C., a temperature rise time, temperature uniformity of a surface and an oxygen amount were examined in the manner described below. It is to be noted that for the electrostatic chucks of Test examples 18 to 20, only the warp amount was examined. The results are shown in Table 3.

EXAMPLE 10

Manufacture of Electrostatic Chuck (1) A green sheet, which was 0.47 mm in thickness, was obtained by: using a paste prepared by mixing 100 parts by weight of aluminum nitride powder fired in the air at 500° C. for one hour (manufactured by Tokuyama Corp., average particle diameter 1.1 μm), 4 parts by weight of yttria (average particle diameter 0.4 μm), 11.5 parts by weight of acrylic binder, 0.5 part by weight of a dispersant and 53 parts by weight of alcohol comprising 1-butanol and ethanol; and forming it by a doctor blade method.

(2) Subsequently, after drying these green sheets at 80° C. for 5 hours, to the green sheets having a necessity of being processed, portions which will become through holes, in which lifter pins for a semiconductor wafer, 1.8 mm, 3.0 mm and 5.0 mm in diameter, respectively, and portions which will become conductor-filled through holes for being connected with external terminals were formed by punching.

(3) Conductor containing paste A was prepared by mixing 100 parts by weight of tungsten carbide particles having an average particle diameter of 1 μm, 3.0 parts by weight of an acrylic binder, 3.5 parts by weight of α-terpineol and 0.3 part by weight of a dispersant.

Conductor containing paste B was prepared by mixing 100 parts by weight of tungsten particles having an average particle diameter of 3 μm, 1.9 parts by weight of an acrylic binder, 3.7 parts by weight of α-terpineol and 0.2 part by weight of a dispersant.

By printing this conductor containing paste A to the green sheet by screen printing, a conductor containing paste layer having an electrostatic electrode pattern with a shape shown in FIG. 5 was formed.

Furthermore, conductor containing paste B was filled in the through hole for conductor-filled through holes for being connected with external terminals.

On the green sheet with the electrostatic electrode pattern formed thereon, 1 green sheet with no tungsten paste printed was stacked on its top side (the heating face); and 48 green sheets were stacked on its bottom side. Then, the resultant was pressed at a temperature of 130° C. and a pressure of 80 kg/cm² to form a lamination (FIG. 8(a)).

(4) Next, an aluminum nitride plate 3 mm in thickness was obtained by degreasing the obtained lamination in the nitrogen gas at 600° C. for 5 hours and hot pressing it at 1890° C. at a pressure of 150 kg/cm² for 3 hours. This lamination was cut into a disk-shape of 300 mm in diameter to form a plate made of aluminum nitride having therein a chuck positive electrostatic layer 2 and a chuck negative electrostatic layer 3, each layer having a thickness of 10 μm.

(5) Subsequently, a mask was placed on the bottom face of the plate obtained in (4) and concave portions for thermocouples (not shown) and the like were formed on the surface by blast treatment with SiC and the like.

(6) Next, a resistance heating element was printed on the face opposite to the wafer treating face. For the printing, a conductor containing paste was used. The conductor containing paste used was Solbest PS603D manufactured by Tokuriki Kagaku Kenkyusyo:CO, which has been used for the formation of plated through holes in printed circuit boards. This conductor containing paste was a silver/lead paste and contained 7.5 parts by weight, per 100 parts by weight of silver, of metal oxides comprising lead oxide, zinc oxide, silica, boron oxide and alumina (the weight ratio thereof being 5/55/10/25/5).

The silver had a scaly shape having an average particle diameter of 4.5 μm.

(7) Next, the silver and the lead in the conductor containing paste were sintered and baked on the ceramic substrate by heating and firing, at 780° C., the plate printed with the conductor containing paste. Subsequently, a nickel layer 1 μm in thickness containing 1% by weight or less of boron was deposited on the surface of the silver sintered body 15 by the immersion of the plate in an electroless nickel plating bath comprising an aqueous solution containing 30 g/L of nickel sulfate, 30 g/L of boric acid, 30 g/L of ammonium chloride and 60 g/L of Rochelle salt. The plate was, then, subjected to annealing treatment at 120° C. for 3 hours.

The resistance heating element comprising the silver sintered body was 5 μm in thickness and 2.4 mm in width and had an area resistivity of 7.7 mΩ/□.

(8) Next, the ceramic substrate was provided with blind holes to expose a conductor-filled through hole 16. To this blind hole, an external terminal pin made of Kovar was connected by using a gold solder comprising Ni—Au alloy (Au 81.5% by weight, Ni 18.4% by weight, impurities 0.1% by weight) and heating and reflowing at 970° C. Moreover, an external terminal pin made of Kovar was formed on the resistance heating element through a solder (tin 9/lead 1).

(9) Subsequently, a plurality of thermocouples for temperature control were buried in the concave portions, thus an electrostatic chuck is manufactured. As for the resulting electrostatic chuck, a warp amount at 450° C., a temperature rise time, temperature uniformity of a surface and an oxygen amount were examined. The results are shown in Table 3.

EXAMPLE 11

Manufacture of Wafer Prober 201 (Reference to FIG. 6)

(1) A green sheet 0.47 mm in thickness was obtained by forming, by a doctor blade method, a mixed composition prepared by mixing 100 parts by weight of aluminum nitride powder fired in the air at 500° C. for one hour (manufactured by Tokuyama Corp., average particle diameter 1.1 μm), 4 parts by weight of yttria (average particle diameter 0.4 μm), 0.9 part by weight of the amorphous carbon obtained in Example 1 and 53 parts by weight of alcohol comprising 1-butanol and ethanol.

(2) Subsequently, after drying this green sheet at 80° C. for 5 hours, a through hole for a conductor-filled through hole for connecting a heating element and an external terminal pin were formed by punching.

(3) Conductor containing paste A was prepared by mixing 100 parts by weight of tungsten carbide particles having an average particle diameter of 1 μm, 3.0 parts by weight of an acrylic binder, 3.5 parts by weight of α-terpineol solvent and 0.3 part by weight of a dispersant.

Conductor containing paste B was prepared by mixing 100 parts by weight of tungsten particle having an average particle diameter of 3 μm, 1.9 parts by weight of an acrylic binder, 3.7 parts by weight of α-terpineol solvent and 0.2 part by weight of a dispersant.

Subsequently, to the green sheet were printed a printed element in a lattice-shape for a guard electrode and printed element in a lattice-shape for a ground electrode by screen printing using this conductor containing paste A. Conductor containing paste B was filled in the through hole for a conductor-filled through hole for being connected with a terminal pin.

Moreover, the green sheet with printed element and 50 green sheets with no printed element were stacked at 130° C. at a pressure of 80 kg/cm² to obtain a lamination.

(4) Next, an aluminum nitride plate of 3 mm in thickness was obtained by degreasing this lamination in the nitrogen gas at 600° C. for 5 hours and hot pressing it at 1890° C. at a pressure of 150 kg/cm² for 3 hours. The resulting plate was cut into a disk-shape of 300 mm in diameter to form a plate made of ceramic. The size of the conductor-filled through hole 16 was 0.2 mm in diameter and 0.2 mm in depth.

Furthermore, both guard electrode 45 and ground electrode 46 had a thickness of 10 μm. The position where the guard electrode 45 was formed was 1 mm apart from the wafer treating face and where the ground electrode 46 was formed was 1.2 mm apart from the wafer treating face. The length of one side of the areas 46a where no conductor was formed in the guard electrode 45 and the ground electrode 46 was 0.5 mm.

(5) After grinding of the plate obtained in (4) with a diamond grind stone, a mask was placed on the body and a concave portion for a thermocouple and a groove 47 for wafer adsorption (width: 0.5 mm, depth: 0.5 mm) were provided on the surface by blast treatment with SiC and the like.

(6) Furthermore, a layer for forming a heating element 49 was printed on the face opposing the wafer treating face. For the printing, a conductor containing paste was used. The conductor containing paste used was Solbest PS603D manufactured by Tokuriki Kagaku Kenkyusyo:CO, which has been used for the formation of plated through holes in printed circuit boards. This conductor containing paste was a silver/lead paste and contained 7.5 parts by weight, per 100 parts by weight of silver, of metal oxides comprising lead oxide, zinc oxide, silica, boron oxide and alumina (the weight ratio thereof being5/55/10/25/5).

The silver had a scaly shape having an average particle diameter of 4.5 $\mu$m.

(7) Next, the silver and the lead in the conductor containing paste were sintered and baked on the ceramic substrate 43 by heating and firing, at 780° C., the heater plate printed with the conductor containing paste. Subsequently, a nickel layer (not shown) 1 $\mu$m in thickness containing 1% by weight or less of boron was deposited on the surface of the silver sintered body 49 by the immersion of the heater plate in an electroless nickel plating bath comprising an aqueous solution containing 30 g/L of nickel sulfate, 30 g/L of boric acid, 30 g/L of ammonium chloride and 60 g/L of Rochelle salt. The heater plate was, then, subjected to annealing treatment at 120° C. for 3 hours. The heating element comprising the silver sintered body was 5 $\mu$m in thickness and 2.4 mm in width and had an area resistivity of 7.7 m$\Omega$/□.

(8) On the surface with a groove 47, a titanium layer, a molybdenum layer and a nickel layer were formed sequentially by a sputtering method. The equipment used for the sputtering was SV-4540 manufactured by ULVAC JAPAN LTD. The sputtering conditions were as follows, the pressure: 0.6 Pa, the temperature: 100° C., and the electric power: 200 W. The sputtering time was adjusted in the range from 30 seconds to one minute for every metal. An image detected with a fluorescent X-ray analyzer showed that the thicknesses of the resulting films were 0.3 $\mu$m for the titanium layer, 2 $\mu$m for the molybdenum layer and 1 $\mu$m for the nickel layer.

(9) A nickel layer of 7 $\mu$m in thickness containing 1% by weight or less of boron was deposited on the surface of the metal layer formed by the sputtering, by the immersion of the ceramic board obtained in (8) in an electroless nickel plating bath comprising an aqueous solution containing 30 g/L of nickel sulfate, 30 g/L of boric acid, 30 g/L of ammonium chloride and 60 g/L of Rochelle salt. The resulting ceramic board was subjected to annealing treatment at 120° C. for 3 hours.

No electric current was applied on the surface of the heating element, so the surface was not covered with any electrolytic nickel plating.

Furthermore, a gold plating layer of 1 $\mu$m in thickness was deposited on the nickel plating layer by immersing the surface in an electroless gold plating solution containing 2 g/L of potassium gold cyanide, 75 g/L of ammonium chloride, 50 g/L of sodium citrate and 10 g/L of sodium hypophosphite under the condition of 93° C. for one minute.

(10) An air suction hole 48 extending from the groove 47 to the back face was formed by drill processing and further a blind hole (not shown) for exposing a conductor-filled through hole 16 was formed. To this blind hole, an external terminal pin made of Kovar was connected by using a gold solder comprising Ni—Au alloy (Au 81.5% by weight, Ni 18.4% by weight, impurities 0.1% by weight) with heating and reflowing at 970° C. Moreover, an external terminal pin made of Kovar was formed on the heating element through a solder (tin 90% by weight/lead 10% by weight)

(11) Subsequently, a plurality of thermocouples for temperature control were buried in the concave portions, thus, a wafer prober 201 is obtained. As for the obtained wafer prober 201, a warp amount at 200° C., a temperature rise time and an oxygen amount were examined. The results are shown in Table 3.

EXAMPLES 12 TO 14

Electrostatic Chucks Made of SiC with a Heater

Green sheets 50, which were 0.47 mm in thickness, were obtained by: using a paste prepared by mixing 100 parts by weight of silicon carbide powder fired in the air at 500° C. for one hour (manufactured by Yakushima Electric Industries, Ltd., average particle diameter 1.1 $\mu$m), 4 parts by weight of carbon, 11.5 parts by weight of acrylic binder, 0.5 part by weight of a dispersant and 53 parts by weight of alcohol comprising 1-butanol and ethanol; and forming it by a doctor blade method. A glass paste was applied to: a green sheet on which a conductor layer was to be formed; and a green sheet which was to become the uppermost layer among the green sheets. Incidentally, regarding the green sheet on which a conductor layer was to be formed, the glass paste was applied to both sides of conductor containing paste, thereby establishing a sandwich state. Thereafter, the same processes as (2) to (8) in Examples 7 to 9 were performed to manufacture electrostatic chucks.

The diameter and the thickness of the resulting electrostatic chucks and the position of the conductor layer in the electrostatic chucks were: diameter: 280 mm, thickness: 19 mm, 45% from the back face (Example 12); diameter: 310 mm, thickness: 5 mm, 33% from the back face (Example 13); and diameter: 350 mm, thickness: 3 mm, 20% from the back face (Example 14).

EXAMPLE 15

SiC Hot Plate

A silicon carbide sintered body was obtained: by mixing 100 parts by weight of silicon carbide powder (manufactured by Yakushima Electric Industries, Ltd., average particle diameter 1.1 $\mu$m) fired in the air at 500° C. for one hour, 4 parts by weight of carbon and 11.5 parts by weight of acrylic resin binder; putting the mixture into a hexagonal columnar mold; and then hot pressing it in a nitrogen atmosphere under the following conditions: 1890° C. and a pressure of 150 kg/cm$^2$ for 3 hours. Thereafter, the same processes as (2) to (6) in Example 1 were performed to manufacture a ceramic substrate. This sintered body was processed into a disk having a diameter of 300 mm and a thickness of 3 mm (Example 15). A glass paste was applied to a surface of the resulting disk and was fired in the air at 1000° C. to form an insulating layer. Thereafter, a conductor containing paste was printed on the insulating layer, resulting in a hot plate.

TEST EXAMPLES 25 TO 27

Manufacture was performed in the same manner as Example 15 but under such conditions that the following particulars are achieved; diameter: 240 mm, thickness: 5 mm, 33% from the back face (Test example 25); diameter: 310 mm, thickness: 30 mm, 33% from the back face (Test example 26); and diameter: 240 mm, thickness: 17 mm, 33% from the back face and SiC is not fired

TEST EXAMPLE 27

As for Examples 12 to 15 and Test examples 25 to 27, a warp amount at 450° C., a temperature rise time, temperature uniformity of a surface and an oxygen amount were examined. The results are shown in Table 4.

TEST EXAMPLE 28

This example was the same as Test examples 6 and 14 except that no through hole for a lifter pin was formed. In the case where no through hole for a lifter pin was formed, the warp amount was as much as about 10 μm even when a hot plate was heated to 450° C.

The ceramic substrates of the preceding Examples and Test examples were evaluated by the following methods.

Evaluation Methods (1) Uniformity of Surface Temperature

Using a thermoviewer (IR162012-0012, manufactured by Nippon Datum Co., Ltd.),temperatures at some points in the wafer treating face of a ceramic substrate were measured and the difference between the maximum temperature and the minimum temperature was obtained.

(2) Temperature-Rising Property

The time required for raising temperature to 450° C. was measured.

(3) Warp Amount

By raising temperature to 450° C. and cooling to 25° C., the warp amount was measured with a configuration meter (Nanoway, manufactured by Kyocera Corporation).

(4) Oxygen Amount

A sample sintered under the same conditions as a sintered body of the Example was pulverized with a tungsten mortar and a 0.01-gram portion of the sample was taken, and the oxygen amount is measured with an oxygen/nitrogen determinator (Model TC-136, manufactured by LECO Corporation) under the following conditions: a sample heating temperature 2200° C. and a heating time 30 seconds.

TABLE 1

| Example No. | Diameter (mm) | Thickness (mm) | Heating element-formed position | Warp amount (μm) | Temperature rise time (sec) | Temperature uniformity (° C.) | Oxygen amount (wt %) |
|---|---|---|---|---|---|---|---|
| Example 1 | 280 | 19 | Back face | 5 | 160 | 5 | 1.6 |
| Example 2 | 310 | 5 | Back face | 10 | 96 | 4 | 1.6 |
| Example 3 | 350 | 3 | Back face | 10 | 90 | 4 | 1.6 |
| Test example 1 | 240 | 5 | Back face | 10 | 90 | 4 | 1.6 |
| Test example 2 | 310 | 30 | Back face | 5 | 1000 | 10 | 1.6 |
| Test example 3 | 300 | 17 | 33% from back face | 30 | 1000 | 10 | <0.05 |
| Test example 4 | 240 | 5 | None | 10 | | | |
| Test example 5 | 310 | 30 | None | 10 | | | |
| Test example 6 | 300 | 17 | None | 70 | | | |

TABLE 2

| Example No. | Diameter (mm) | Thickness (mm) | Heating element-formed position | Warp amount (μm) | Temperature rise time (min) | Temperature uniformity (° C.) |
|---|---|---|---|---|---|---|
| Example 4 | 280 | 19 | 45% from back face | 10 | 30 | 15 |
| Example 5 | 310 | 5 | 33% from back face | 10 | 20 | 10 |
| Example 6 | 350 | 3 | 20% from back face | 10 | 20 | 10 |
| Test example 7 | 240 | 5 | 33% from back face | 10 | 20 | 10 |
| Test example 8 | 310 | 30 | 33% from back face | 5 | 50 | 20 |
| Test example 9 | 300 | 17 | 33% from back face | 30 | — | — |
| Test example 10 | 240 | 5 | None | 10 | | |
| Test example 11 | 310 | 30 | None | 10 | | |

TABLE 2-continued

| Example No. | Diameter (mm) | Thickness (mm) | Heating element-formed position | Warp amount (μm) | Temperature rise time (min) | Temperature uniformity (° C.) |
|---|---|---|---|---|---|---|
| Test example 12 | 300 | 17 | None | 70 | | |
| Test example 13 | 300 | 5 | 50% from back face | 20 | 30 | 20 |
| Test example 14 | 300 | 5 | 66% from back face | 70 | 30 | 20 |

TABLE 3

| Example No. | Diameter (mm) | Thickness (mm) | Heating element-formed position | Warp amount (μm) | Temperature rise time (sec) | Temperature uniformity (° C.) | Oxygen amount (wt %) |
|---|---|---|---|---|---|---|---|
| Example 7 | 280 | 19 | 45% from back face | 10 | 200 | 7 | 0.4 |
| Example 8 | 310 | 5 | 33% from back face | 10 | 96 | 4 | 0.8 |
| Example 9 | 350 | 3 | 20% from back face | 10 | 90 | 4 | 1.6 |
| Example 10 | 300 | 3 | Back face | 10 | 90 | 3 | 1.6 |
| Example 11 | 300 | 3 | Back face | 8 | 60 | — | 1.6 |
| Test example 15 | 240 | 5 | 33% from back face | 10 | 90 | 4 | 1.6 |
| Test example 16 | 310 | 30 | 33% from back face | 5 | 1000 | 10 | 1.6 |
| Test example 17 | 300 | 17 | 33% from back face | 30 | 1000 | 10 | <0.05 |
| Test example 18 | 240 | 5 | None | 10 | | | |
| Test example 19 | 310 | 30 | None | 10 | | | |
| Test example 20 | 300 | 17 | None | 80 | | | |
| Test example 21 | 300 | 5 | 50% from back face | 20 | 90 | 7 | 1.6 |
| Test example 22 | 300 | 5 | 66% from back face | 80 | 90 | 10 | 1.6 |
| Test example 23 | 300 | 5 | 33% from back face | 80 | 110 | 10 | <0.05 |
| Test example 24 | 300 | 5 | 33% from back face | 50 | 110 | 10 | 16 |

TABLE 4

| Example No. | Diameter (mm) | Thickness (mm) | Heating element-formed position | Warp amount (μm) | Temperature rise time (sec) | Temperature uniformity (° C.) | Oxygen amount (wt %) |
|---|---|---|---|---|---|---|---|
| Example 12 | 280 | 19 | 45% from back face | 10 | 200 | 6 | 0.3 |
| Example 13 | 310 | 5 | 33% from back face | 10 | 96 | 3 | 0.3 |
| Example 14 | 350 | 3 | 20% from back face | 10 | 90 | 3 | 0.3 |
| Example 15 | 300 | 3 | Back face | 10 | 90 | 2 | 0.3 |
| Test example 25 | 240 | 5 | 33% from back face | 10 | 90 | 3 | 0.3 |
| Test example 26 | 310 | 30 | 33% from back face | 5 | 1000 | 10 | 0.3 |
| Test example 27 | 300 | 17 | 33% from back face | 70 | 1000 | 10 | <0.05 |

As is clear from the results shown in Tables 1 to 4, the ceramic substrates of the hot plates and the like according to the examples took short temperature rise times and superior in both the temperature-following property and the temperature uniformity. Furthermore, the warp amount at a high temperature can be made small.

INDUSTRIAL APPLICABILITY

As described above, the present invention can provide a substantially uniform temperature distribution for a wafer treating face since the above-mentioned ceramic substrate has a thickness of 25 mm or less. For example, when a semiconductor wafer and the like is placed, the damage thereon and the like caused by the non-uniformity of the temperature of the wafer treating face can be prevented.

What is claimed is:

1. A ceramic heater for a semiconductor-producing/examining device having a ceramic substrate and a conductor formed on a surface of said ceramic substrate or inside said ceramic substrate,
   wherein said ceramic substrate comprises a nitride ceramic or a carbide ceramic, contains oxygen and has a disc form, the diameter thereof exceeding 250 mm and a thickness thereof being 25 mm or less.

2. The ceramic heater for a semiconductor-producing/examining device according to claim 1,
   wherein said ceramic substrate is used in a temperature range of 100° C. to 700° C.

3. The ceramic heater for a semiconductor-producing/examining device according to claim 1,
   wherein said ceramic substrate has a plurality of through holes in which lifter pins are inserted.

4. The ceramic heater for a semiconductor-producing/examining device according to claim 1,
   wherein said conductor is formed in a region up to the position of 60% in a thickness-direction from a face opposite to a wafer treating face of ceramic substrate.

5. The ceramic heater for a semiconductor-producing/examining device according to claim 1,
   wherein said ceramic substrate contains 0.05 to 10% by weight of oxygen.

6. The ceramic heater for a semiconductor-producing/examining device according to claim 1,
   wherein said ceramic substrate contains an oxide as a sintering aid.

7. The ceramic heater for a semiconductor-producing/examining device according to claim 1,
   wherein said ceramic substrate contains a sintering aid comprising at least one member selected from the group consisting of an alkali metal oxide, an alkaline earth metal oxide and a rare-earth oxide.

8. The ceramic heater for a semiconductor-producing/examining device according to claim 1,
   wherein said ceramic substrate contains 0.1 to 20% by weight of an oxide as a sintering aid.

9. The ceramic heater for a semiconductor-producing/examining device according to claim 1,
   wherein said ceramic substrate has a diameter of 300 mm or more.

10. The ceramic heater for a semiconductor-producing/examining device according to claim 1,
    wherein said ceramic substrate comprises an electrostatic electrode.

* * * * *